US012720768B2

(12) United States Patent
Lee et al.

(10) Patent No.: US 12,720,768 B2
(45) Date of Patent: Aug. 25, 2026

(54) SEMICONDUCTOR DEVICE AND ELECTRONIC SYSTEM INCLUDING THE SAME

(71) Applicant: Samsung Electronics Co., Ltd., Suwon-si (KR)

(72) Inventors: Bongyong Lee, Suwon-si (KR); Taeyoung Kim, Suwon-si (KR); Hyunmog Park, Suwon-si (KR); Siyeon Cho, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 617 days.

(21) Appl. No.: 18/149,929

(22) Filed: Jan. 4, 2023

(65) Prior Publication Data

US 2023/0329012 A1 Oct. 12, 2023

(30) Foreign Application Priority Data

Apr. 11, 2022 (KR) ........................ 10-2022-0044478

(51) Int. Cl.
*H10B 80/00* (2026.01)
*H10B 41/27* (2023.01)
*H10B 43/27* (2023.01)

(52) U.S. Cl.
CPC ............. *H10B 80/00* (2023.02); *H10B 41/27* (2023.02); *H10B 43/27* (2023.02)

(58) Field of Classification Search
None
See application file for complete search history.

(56) References Cited

U.S. PATENT DOCUMENTS

2009/0039415 A1* 2/2009 Choi ................. H01L 21/28194 427/96.8
2012/0098048 A1 4/2012 Choe et al.
(Continued)

FOREIGN PATENT DOCUMENTS

KR 10-2012-0041312 A 5/2012
KR 10-2019-0115508 A 10/2019
(Continued)

OTHER PUBLICATIONS

Extended European Search Report dated Aug. 9, 2023 issued in European Patent Application No. 23156802.3-1212.
(Continued)

*Primary Examiner* — Julio J Maldonado
*Assistant Examiner* — Pinaki Das
(74) *Attorney, Agent, or Firm* — Fish & Richardson P.C.

(57) ABSTRACT

A semiconductor device may include a first substrate structure including a substrate, circuit elements on the substrate, and first bonding layers on the circuit elements, and a second substrate structure on the first substrate structure. The second substrate structure may include a plate layer, an intermediate insulating layer below the plate layer and including silicon nitride, gate electrodes below the intermediate insulating layer and stacked to be spaced apart from each other in a vertical direction, a channel structure in a channel hole passing through the intermediate insulating layer and the gate electrodes and including a semiconductor layer, and second bonding layers connected to the first bonding layers. The channel hole may have a first width in a first portion passing through the gate electrodes and a second width, wider than the first width, in a second portion passing through the intermediate insulating layer.

20 Claims, 26 Drawing Sheets

(56) References Cited

U.S. PATENT DOCUMENTS

| | | | | |
|---|---|---|---|---|
| 2013/0270625 | A1* | 10/2013 | Jang | H10D 30/693 257/324 |
| 2014/0167129 | A1* | 6/2014 | Kim | H10B 41/42 257/314 |
| 2014/0273373 | A1 | 9/2014 | Makala et al. | |
| 2015/0200259 | A1 | 7/2015 | Lim et al. | |
| 2018/0261623 | A1 | 9/2018 | Higashi et al. | |
| 2019/0164983 | A1* | 5/2019 | Hu | H10B 41/35 |
| 2019/0288001 | A1* | 9/2019 | Yu | H10B 43/27 |
| 2019/0393353 | A1 | 12/2019 | Jeong et al. | |
| 2021/0036002 | A1 | 2/2021 | Lee | |
| 2021/0057430 | A1* | 2/2021 | Lee | H10B 12/0335 |
| 2021/0118901 | A1 | 4/2021 | Yang | |
| 2021/0296325 | A1 | 9/2021 | Wu et al. | |
| 2021/0313344 | A1 | 10/2021 | Ryu et al. | |
| 2021/0384221 | A1 | 12/2021 | Song et al. | |
| 2021/0408290 | A1 | 12/2021 | Jeong et al. | |
| 2022/0344244 | A1* | 10/2022 | Ryu | H01L 23/481 |

FOREIGN PATENT DOCUMENTS

| | | | |
|---|---|---|---|
| KR | 10-2020-0000664 | A | 1/2020 |
| KR | 10-2020-0013431 | A | 2/2020 |
| KR | 10-2020-0132790 | A | 11/2020 |
| KR | 10-2021-0023291 | A | 3/2021 |
| KR | 10-2021-0027580 | A | 3/2021 |
| KR | 10-2021-0155610 | A | 12/2021 |

OTHER PUBLICATIONS

Office Action in Korean Appln. No. 10-2022-0044478, mailed on Oct. 22, 2025, 30 pages (with English translation).

* cited by examiner

SEMICONDUCTOR DEVICE AND ELECTRONIC SYSTEM INCLUDING THE SAME

CROSS-REFERENCE TO RELATED APPLICATION(S)

This application claims benefit of priority to Korean Patent Application No. 10-2022-0044478 filed on Apr. 11, 2022 in the Korean Intellectual Property Office, the disclosure of which is incorporated herein by reference in its entirety.

BACKGROUND

The present inventive concepts relate to semiconductor devices and/or electronic systems including the same.

Electronic systems requiring data storage require a semiconductor device capable of storing high-capacity data. Accordingly, a method for increasing data storage capacity of semiconductor devices has been studied. For example, as a method for increasing data storage capacity of semiconductor devices, a semiconductor device including memory cells arranged three-dimensionally, instead of memory cells arranged two-dimensionally, has been proposed.

SUMMARY

An aspect of the present inventive concepts is to provide a semiconductor device having improved operating characteristics and reliability.

An aspect of the present inventive concepts is to provide an electronic system including a semiconductor device having improved operating characteristics and reliability.

According to an aspect of the present inventive concepts, a semiconductor device includes a first substrate structure including a substrate, circuit elements on the substrate, a first interconnection structure on the circuit elements, and first bonding layers on the first interconnection structure, and a second substrate structure on the first substrate structure. The second substrate structure may include a plate layer, an intermediate insulating layer below the plate layer, a stack structure below the intermediate insulating layer and including gate electrodes and interlayer insulating layers alternately stacked on each other in a first direction, the first direction being perpendicular to a lower surface of the intermediate insulating layer, a channel structure including a dielectric layer, a first semiconductor layer, a second semiconductor layer, and a buried layer that are in sequence from the stack structure in a channel hole, the channel hole passing through the intermediate insulating layer and the stack structure and extending in the first direction, a second interconnection structure below the channel structure and the stack structure, and second bonding layers below the second interconnection structure and connected to the first bonding layers. In the channel hole, the intermediate insulating layer may have a first side surface, the stack structure may have a second side surface that is not aligned with the first side surface, and the stack structure may have an upper surface exposed from the intermediate insulating layer. The dielectric layer and the first semiconductor layer may cover the first side surface of the intermediate insulating layer and the second side surface and the upper surface of the stack structure. The second semiconductor layer may cover a portion of the second side surface of the stack structure and may be at a level lower than a level of a lower surface of an uppermost gate electrode among the gate electrodes of the stack structure.

According to an aspect of the present inventive concepts, a semiconductor device may include a first substrate structure including a substrate, circuit elements on the substrate, and first bonding layers on the circuit elements, and a second substrate structure on the first substrate structure. The second substrate structure may include a plate layer, an intermediate insulating layer below the plate layer and including silicon nitride, gate electrodes below the intermediate insulating layer and stacked to be spaced apart from each other in a first direction, the first direction being perpendicular to a lower surface of the intermediate insulating layer, a channel structure in a channel hole passing through the intermediate insulating layer and the gate electrodes and extending in the first direction, the channel structure including a semiconductor layer, and second bonding layers below the gate electrodes and connected to the first bonding layers. The channel hole may have a first width in a first portion passing through the gate electrodes and a second width in a second portion passing through the intermediate insulating layer, the second width being wider than the first width. The plate layer may include a protrusion in contact with the semiconductor layer in the second portion.

According to an aspect of the present inventive concepts, an electronic system may include a semiconductor storage device including a first substrate structure including circuit elements and first bonding layers, a second substrate structure including second bonding layers connected to the first bonding layers, and an input/output pad electrically connected to the circuit elements, and a controller electrically connected to the semiconductor storage device through the input/output pad and configured to control the semiconductor storage device. The second substrate structure may include a plate layer, an intermediate insulating layer below the plate layer and including silicon nitride, gate electrodes below the intermediate insulating layer and stacked to be spaced apart from each other in a first direction, the first direction being perpendicular to a lower surface of the intermediate insulating layer, and a channel structure in a channel hole passing through the intermediate insulating layer and the gate electrodes and extending in the first direction, the channel structure including a semiconductor layer. The channel hole may have a first width in a first portion passing through the gate electrodes and a second width in a second portion passing through the intermediate insulating layer, the second width being wider than the first width. The plate layer may include a protrusion in contact with the semiconductor layer in the second portion.

BRIEF DESCRIPTION OF DRAWINGS

The above and other aspects, features, and advantages of the present inventive concepts will be more clearly understood from the following detailed description, taken in conjunction with the accompanying drawings, in which.

DETAILED DESCRIPTION

Figure 1:
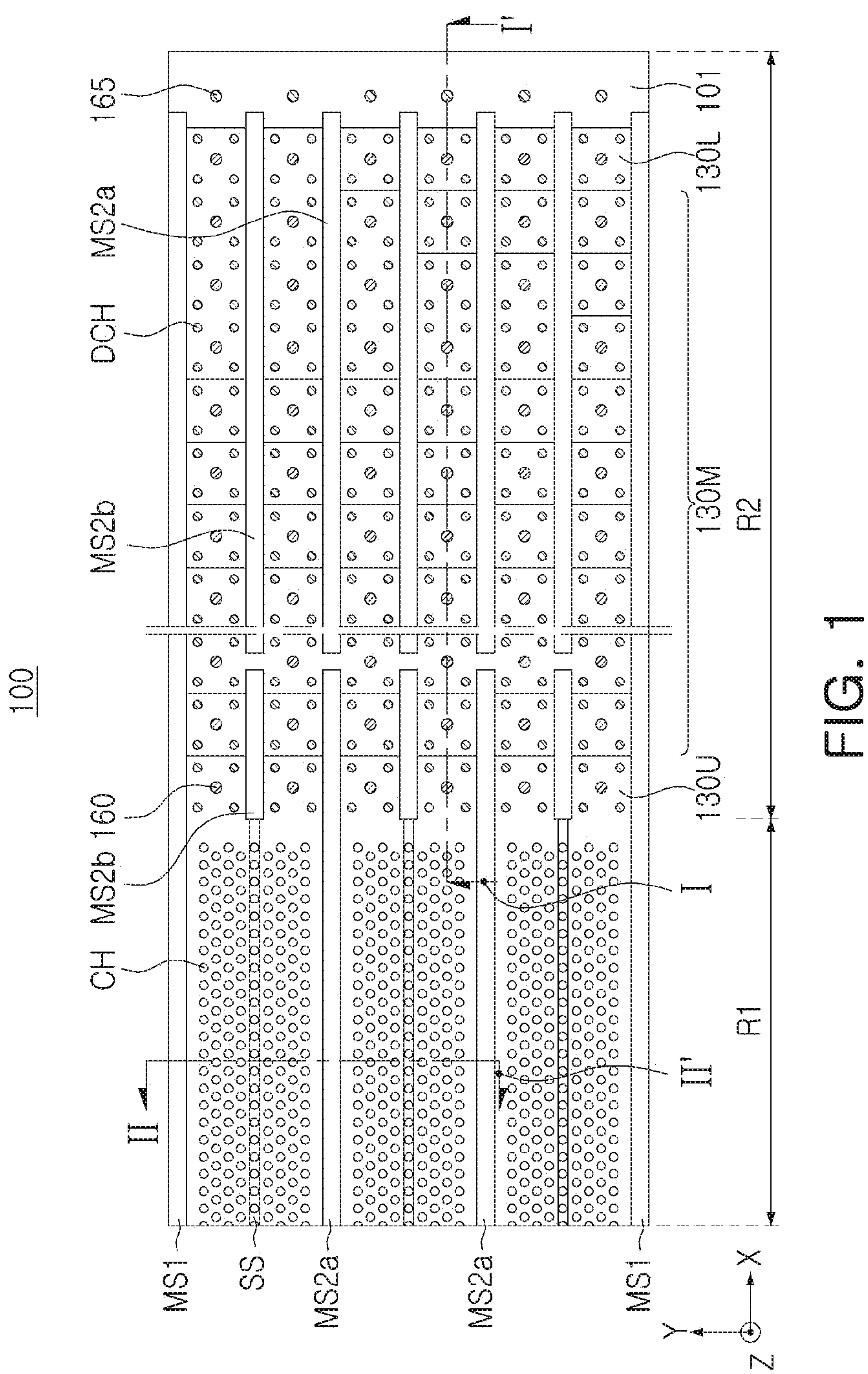
FIG. 1 is a schematic layout diagram of a semiconductor device according to an example embodiment.

Hereinafter, some example embodiments of the present inventive concepts will be described with reference to the accompanying drawings. Hereinafter, terms such as 'top,' 'upper portion,' 'upper surface,' 'bottom', 'lower portion,' 'lower surface', and 'side surface' may be understood with reference to the drawings, except that they are denoted separately by reference numerals.

As used herein, expressions such as "at least one of," when preceding a list of elements, modify the entire list of elements and do not modify the individual elements of the list. Thus, for example, both "(at least) one of A, B, or C" and "(at least) one of A, B, and C" mean either A, B, C or any combination thereof. While the term "same," "equal" or "identical" is used in description of example embodiments, it should be understood that some imprecisions may exist. Thus, when one element is referred to as being the same as another element, it should be understood that an element or a value is the same as another element within a desired manufacturing or operational tolerance range (e.g., ±10%).

When the terms "about" or "substantially" are used in this specification in connection with a numerical value, it is intended that the associated numerical value includes a manufacturing or operational tolerance (e.g., ±10%) around the stated numerical value. Moreover, when the words "about" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a schematic layout diagram of a semiconductor device according to an example embodiment.

Figure 2A:
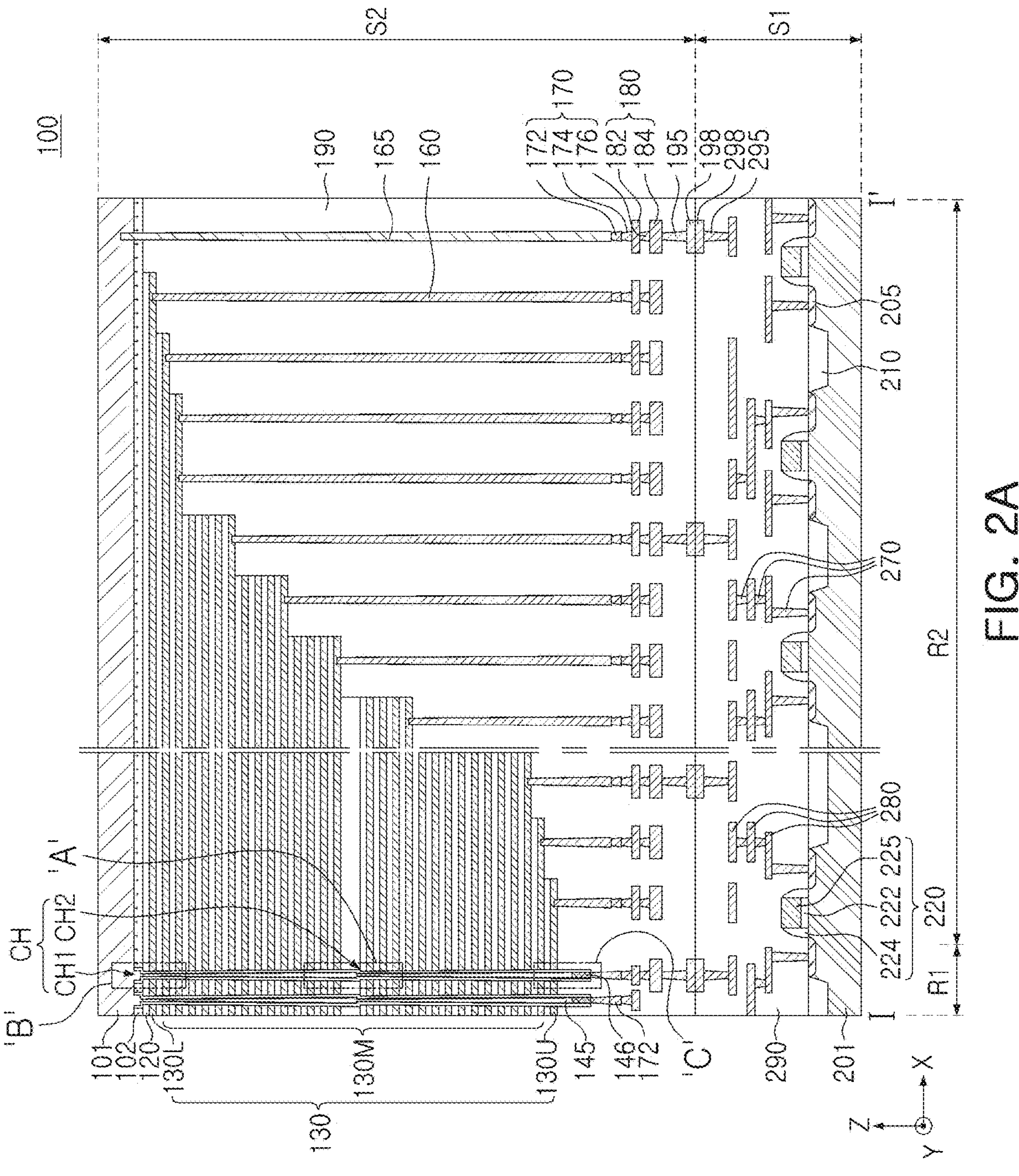
FIGS. 2A and 2B are schematic cross-sectional views of semiconductor devices according to an example embodiment.
Figure 2B:
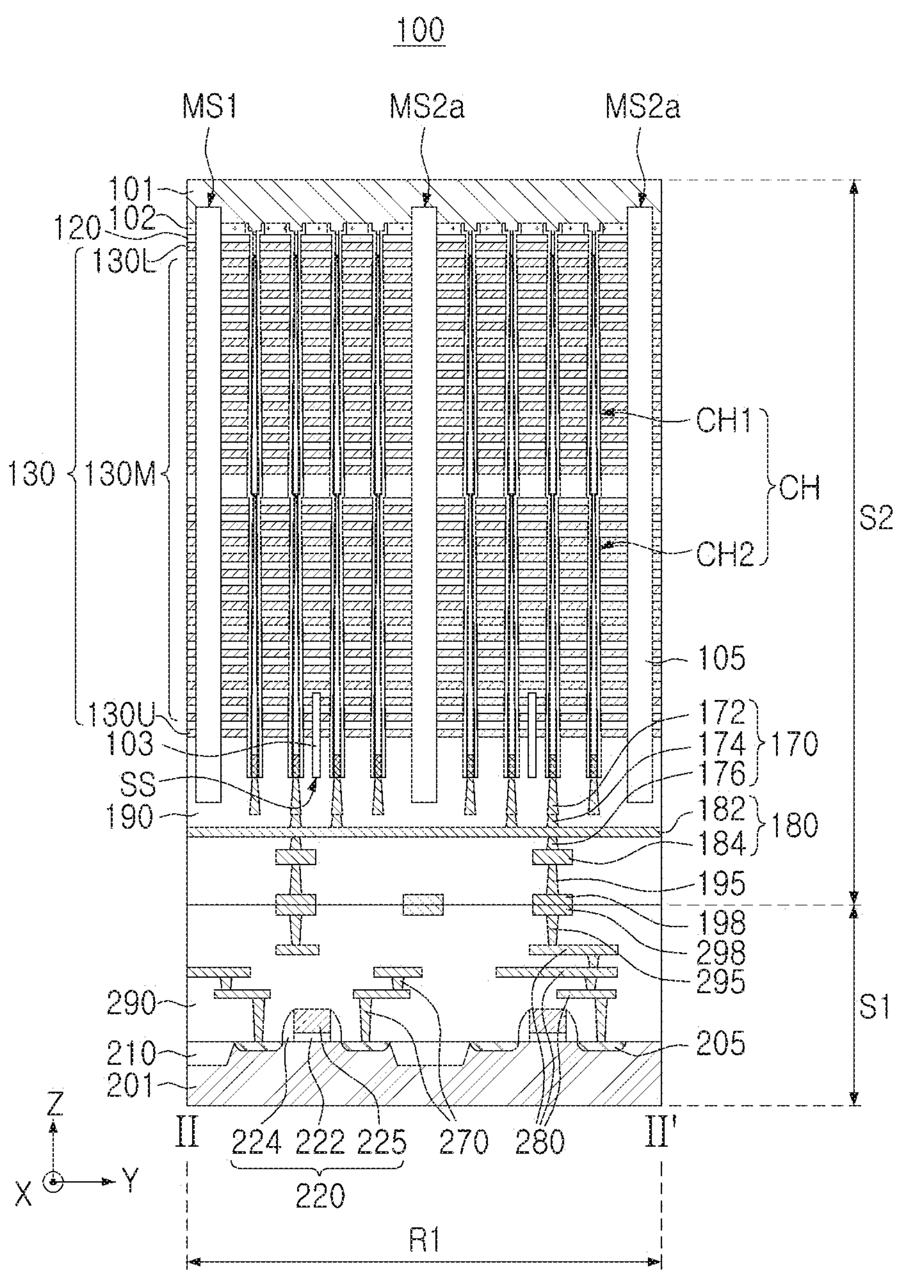

FIGS. 2A and 2B are schematic cross-sectional views of a semiconductor device according to an example embodiment. FIGS. 2A and 2B show cross-sections taken along lines I-I' and II-IF of FIG. 1, respectively.

Figure 3A:
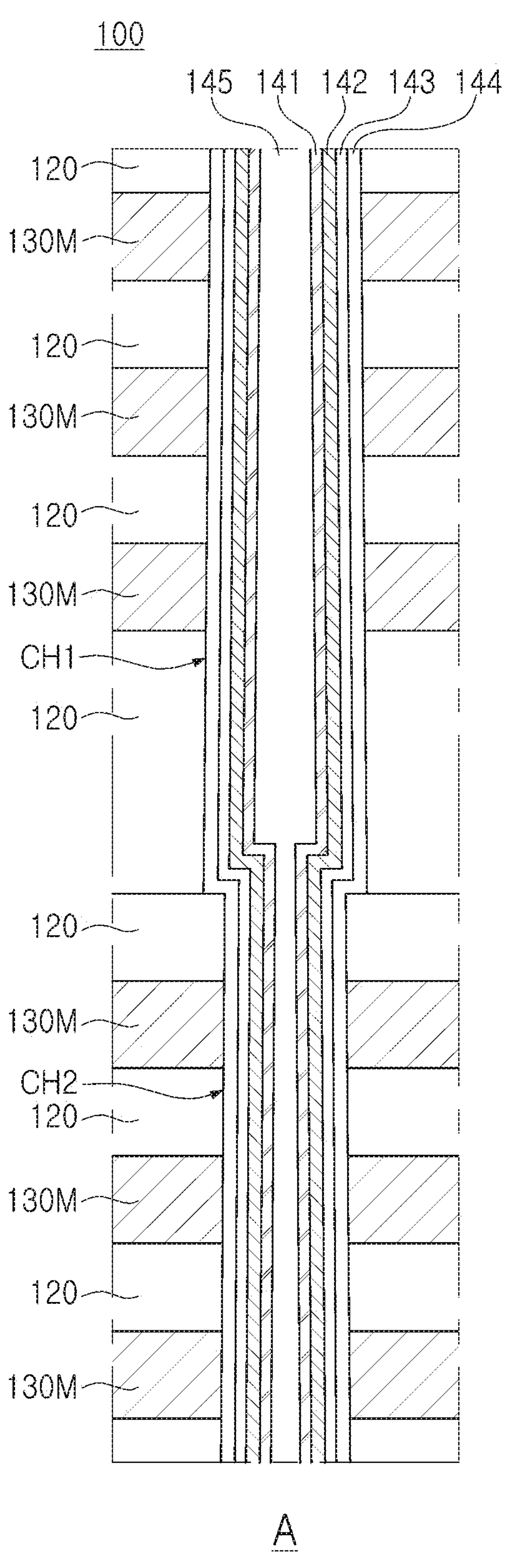
FIGS. 3A to 3C are partially enlarged views of a semiconductor device according to example embodiments.
Figure 3B:
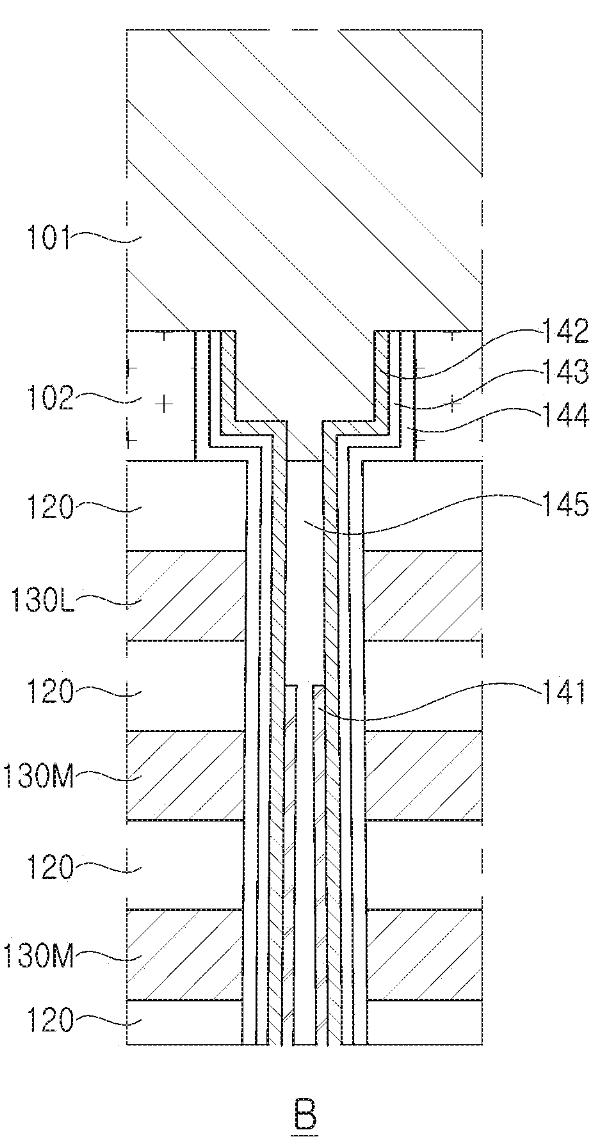
Figure 3C:
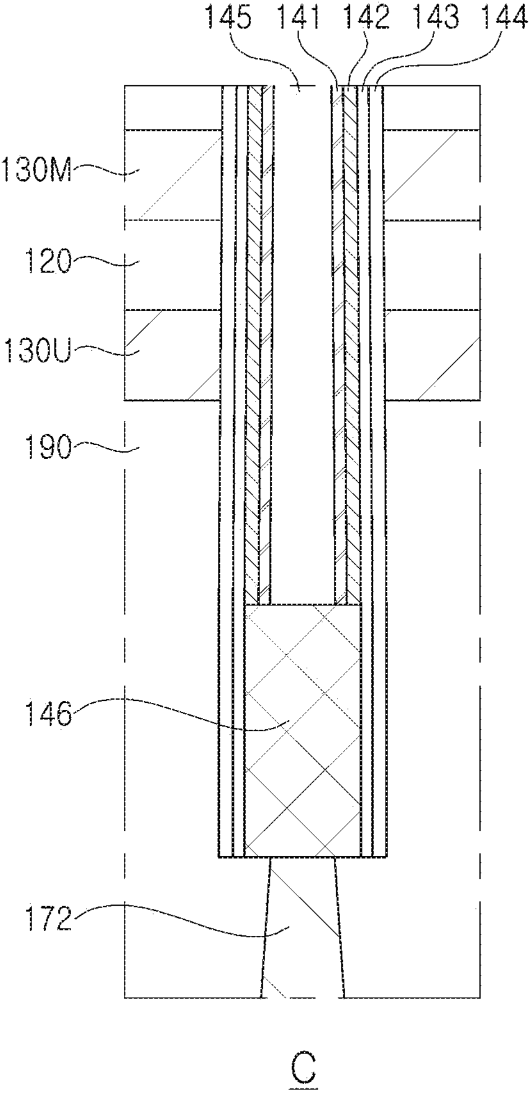

FIGS. 3A to 3C are partially enlarged views of a semiconductor device according to an example embodiment. FIG. 3A is an enlarged view of area 'A' of FIG. 2A, FIG. 3B is an enlarged view of area 'B' of FIG. 2A, and FIG. 3C is an enlarged view of area 'C' of FIG. 2A.

Referring to FIGS. 1 to 3C, a semiconductor device 100 includes first and second substrate structures S1 and S2 stacked vertically. For example, the first substrate structure S1 may include a peripheral circuit region of the semiconductor device 100, and the second substrate structure S2 may include a memory cell region of the semiconductor device 100. In FIG. 1, a plan view is illustrated in a direction in which the second substrate structure S2 is viewed from an interface between the first and second substrate structures S1 and S2.

The first substrate structure S1 may include a substrate 201, source/drain regions 205 and device separation layers 210 in the substrate 201, and circuit elements 220 disposed on the substrate 201, circuit contact plugs 270, circuit interconnection lines 280, a peripheral region insulating layer 290, first bonding vias 295, and first bonding layers 298.

The substrate 201 may have an upper surface extending in an X-direction and a Y-direction. Device separation layers 210 may be formed on the substrate 201 to define an active region. Source/drain regions 205 including impurities may be disposed in a portion of the active region. The substrate 201 may include a semiconductor material, for example, a group IV semiconductor, a group III-V compound semiconductor, or a group II-VI compound semiconductor. For example, the substrate 201 may be provided as a single crystal bulk wafer.

The circuit elements 220 may include planar transistors. Each of the circuit elements 220 may include a circuit gate dielectric layer 222, spacer layers 224, and a circuit gate electrode 225. Source/drain regions 205 may be disposed in the substrate 201 at both sides of the circuit gate electrode 225.

A peripheral region insulating layer 290 may be disposed on the circuit element 220 in the substrate 201. The circuit contact plugs 270 and the circuit interconnection lines 280 may constitute a first interconnection structure of the first substrate structure S1. The circuit contact plugs 270 may have a cylindrical shape and may pass through the peripheral region insulating layer 290 to be connected to the source/drain regions 205. An electrical signal may be applied to the circuit element 220 by the circuit contact plugs 270. In a region (not illustrated), the circuit contact plugs 270 may also be connected to the circuit gate electrode 225. The circuit interconnection lines 280 may be connected to the circuit contact plugs 270, have a line shape, and may be disposed as a plurality of layers. In some example embodiments, the number of layers of the circuit contact plugs 270 and the circuit interconnection lines 280 may be variously changed.

The first bonding vias 295 and the first bonding layers 298 may constitute a first bonding structure and may be disposed in a portion of the uppermost circuit interconnection lines 280. The first bonding vias 295 may have a cylindrical shape, and the first bonding layers 298 may have a line shape. Upper surfaces of the first bonding layers 298 may be exposed to an upper surface of the first substrate structure S1. The first bonding vias 295 and the first bonding layers 298 may function as bonding structures or bonding layers for bonding the first substrate structure S1 to the second substrate structure S2. In addition, the first bonding vias 295 and the first bonding layers 298 may provide an electrical connection path with the second substrate structure S2. In some example embodiments, some of the first bonding layers 298 may be disposed only for bonding, without being connected to the circuit interconnection lines 280 therebelow, as illustrated in FIG. 2B. The first bonding vias 295 and the first bonding layers 298 may include a conductive material, for example, copper (Cu).

In some example embodiments, the peripheral region insulating layer 290 may include a bonding insulating layer having a desired (or alternatively, predetermined) thickness from an upper surface thereof. The bonding insulating layer may be a layer for dielectric-dielectric bonding with the bonding insulating layer of the second substrate structure S2. The bonding insulating layer may also function as a diffusion barrier layer of the first bonding layers 298, and may include, for example, at least one of SiO, SiN, SiCN, SiOC, SiON, and SiOCN.

The second substrate structure S2 may include a plate layer 101 having a first region R1 and a second region R2, an intermediate insulating layer 102 on a lower surface of the plate layer 101, gate electrodes 130 stacked on a lower surface of the intermediate insulating layer 102, interlayer insulating layers 120 alternately stacked with the gate electrodes, channel structures CH passing through the intermediate insulating layer 102 and the gate electrodes, and first and second separation regions MS1, MS2*a*, and MS2*b* extending in one direction through the gate electrodes 130. The second substrate structure S2 may further include insulating regions SS passing through a portion of the gate electrodes 130 and a cell region insulating layer 190 covering the gate electrodes 130. The second substrate structure S2, as a second interconnection structure, may further include gate contacts 160, a substrate contact 165, cell contact plugs 170, and interconnection lines 180 disposed below the gate electrodes 130 and the channel structures CH. The second substrate structure S2, as a second bonding structure, may further include second bonding vias 195 and second bonding layers 198.

The first region R1 of the plate layer 101 may be a region in which the gate electrodes 130 are vertically stacked and the channel structures CH are disposed, and may be a region in which memory cells are disposed. The second region R2 of the plate layer 101 may be a region in which the gate electrodes 130 extend to have different lengths, and may correspond to a region for electrically connecting the memory cells to the first substrate structure S1. The second region R2 may be disposed at at least one end of the first region R1 in at least one direction, for example, the X-direction.

The plate layer 101 may have an upper surface extending in the X-direction and the Y-direction. The plate layer 101 may include a conductive material. For example, the plate layer 101 may include a semiconductor material (e.g., a group IV semiconductor, a group III-V compound semiconductor, or a group II-VI compound semiconductor). For example, the group IV semiconductor may include silicon, germanium, or silicon-germanium. The plate layer 101 may further include impurities. The plate layer 101 may be provided as a polycrystalline semiconductor layer (e.g., a polycrystalline silicon layer). The plate layer 101 may function as part of a common source line.

As illustrated in the enlarged view of FIG. 3B, the plate layer 101 may include protrusions extending into the channel structures CH. The protrusion of the plate layer 101 may be a portion extending to a level below an upper surface of the intermediate insulating layer 102. The protrusions of the plate layer 101 may extend, for example, to about the level of a lower surface of the intermediate insulating layer 102, and the protrusions of the plate layer 101 may contact the buried layer 145 on the lower side. The protrusions of the plate layer 101 may contact the first semiconductor layer 142 inside the channel structures CH. Because the plate layer 101 including the protrusions may contact not only an upper surface of the first semiconductor layer 142 but also an inner surface of the first semiconductor layer 142, a sufficient contact area with the first semiconductor layer 142 may be secured. Because the channel hole in which the channel structure CH is disposed includes an enlarged region having an increased width on the level of the intermediate insulating layer 102, the contact area between the protrusions of the plate layer 101 and the first semiconductor layer 142 may be further increased. Accordingly, contact resistance between the plate layer 101 and the first semiconductor layer 142 may be reduced, and thus operating characteristics of the semiconductor device 100 may be improved.

The semiconductor device 100 may further include a passivation layer (not illustrated) disposed on an upper surface of the plate layer 101. The passivation layer may function as a layer protecting the semiconductor device 100. In an example embodiment, the passivation layer may have openings in some regions, whereby a pad region connected to an external device may be defined. The passivation layer may include at least one of silicon oxide, silicon nitride, and silicon carbide.

The intermediate insulating layer 102 may be disposed on lower surfaces of the first and second regions R1 and R2 of the plate layer 101. The intermediate insulating layer 102 may be disposed between the plate layer 101 and the stack structures 120 and 130.

The intermediate insulating layer 102 may include a region penetrated by the channel structures CH. In the channel hole in which the channel structures CH are disposed, the intermediate insulating layer 102 may include a side surface that is not aligned with side surfaces of the stack structures 120 and 130. For example, the side surface of the intermediate insulating layer 102 may be spaced apart from the side surfaces of the stack structures 120 and 130 in a direction away from the central axis of the channel structure CH. Accordingly, the channel structure CH may have a first width in a portion passing through the stack structure and may have a second width, which is wider than the first width, in a portion passing through the intermediate insulating layer 102. The stack structures 120 and 130 may have upper surfaces exposed by the intermediate insulating layer 102.

The intermediate insulating layer 102 may include an insulating material. In some example embodiments, the intermediate insulating layer 102 may include an insulating material different from the interlayer insulating layers 120. For example, the intermediate insulating layer 102 may include silicon nitride and the interlayer insulating layers 120 may include silicon oxide.

The gate electrodes 130 may be vertically spaced apart from each other and stacked on the lower surface of the plate layer 101 to form a stack structure together with the interlayer insulating layers 120. The stack structure may include vertically stacked lower and upper stack structures. However, in some example embodiments, the stack structure may be formed of a single stack structure.

The gate electrodes 130 may include at least one lower gate electrode 130L forming a gate of a ground select transistor, memory gate electrodes 130M forming the plurality of memory cells, and upper gate electrodes 130U forming gates of string select transistors. Here, the lower gate electrode 130L and the upper gate electrodes 130U may be referred to as "lower" and "upper" based on directions during a manufacturing process. The number of memory gate electrodes 130M constituting memory cells may be determined according to the capacity of the semiconductor device 100. According to an example embodiment, the number of upper gate electrodes 130U and/or lower gate electrodes 130L may be 1 to 4 or more, and the upper gate electrodes 130U and/or the lower gate electrodes 130L may have the same or different structure as those of the memory gate electrodes 130M. In some example embodiments, the gate electrodes 130 may further include a gate electrode disposed below the lower gate electrodes 130L and/or on the upper gate electrode 130U and forms an erase transistor for performing an erase operation using a gate induced drain leakage (GIDL) phenomenon. Further, some of the gate electrodes 130, for example, the memory gate electrodes 130M adjacent to the upper or lower gate electrodes 130U and 130L may be dummy gate electrodes.

The gate electrodes 130 may be vertically spaced apart from each other and stacked on the lower surface of the intermediate insulating layer 102 and may extend to have different lengths in at least one direction to form a step-shaped step difference. The gate electrodes 130 may have a step difference as illustrated in FIG. 2A in the X-direction, and may form a step difference in the Y-direction as well. Due to the step difference, a desired (or alternatively, predetermined) region including end portions of the gate electrodes 130 may be exposed. The gate electrodes 130 may be connected to the gate contacts 160 in the above exposed regions thereof.

The gate electrodes 130 may be at least partially separated in a desired (or alternatively, predetermined) unit by the first and second separation regions MS1, MS2*a*, and MS2*b* in the Y-direction. The gate electrodes 130 may form one memory block between a pair of adjacent first separation regions MS1, but the scope of the memory block is not limited thereto.

The gate electrodes 130 may include a conductive material. The gate electrodes 130 may include, for example, a semiconductor material such as polycrystalline silicon.

The interlayer insulating layers 120 may be disposed between the gate electrodes 130. Like the gate electrodes 130, the interlayer insulating layers 120 may be spaced apart from each other in a direction, perpendicular to the lower surface of the intermediate insulating layer 102, and may extend in the X-direction. The interlayer insulating layers 120 may include an insulating material (e.g., silicon oxide).

The channel structures CH may be spaced apart from each other, while forming rows and columns on the lower surface of the plate layer 101, in the first region R1 of the plate layer 101. The channel structures CH may form a grid pattern or may be disposed in a zigzag shape in one direction. The channel structures CH may have a pillar shape, and/or may have inclined side surfaces narrowing toward the plate layer 101 according to an aspect ratio.

Each of the channel structures CH may have a form in which first and second channel structures CH1 and CH2 passing through the upper and lower stack structures of the gate electrodes 130, respectively, are connected with each other. As illustrated in the enlarged view of FIG. 3A, a bent portion may be formed due to a difference or change in width in the connection region of the first and second channel structures CH1 and CH2. In some example embodiments, some of the channel structures CH may be dummy channels, and as illustrated in FIG. 1, in the second region R2 outside the channel structures CH, dummy channels DCH may be further arranged.

Referring to FIGS. 3A to 3C, the channel structures CH may further include a first dielectric layer 144, a second dielectric layer 143, a first semiconductor layer 142, a second semiconductor layer 141, and a buried layer 145 that are in sequence from the gate electrodes 130 in the X-direction and/or in the Y-direction, and may further include a lower channel pad 146. In the channel hole in which the channel structure CH is disposed, the first dielectric layer 144, the second dielectric layer 143, the first semiconductor layer 142, and the second semiconductor layer 141 may be formed in an annular shape surrounding the internal buried layer 145.

The first and second dielectric layers 144 and 143 and the first semiconductor layer 142 may extend to upper and lower ends of the channel structure CH along the channel hole and may cover an inner surface of the channel hole. The first and second dielectric layers 143 and 144 may cover a side surface of the intermediate insulating layer 102, side surfaces of the stack structures 120 and 130, and upper surfaces of the stack structures 120 and 130 exposed by the intermediate insulating layer 120. Accordingly, the first and second dielectric layers 144 and 143 may include bent portions, as illustrated in FIG. 3B.

The first dielectric layer 144 may contact the gate electrodes 130 through an outer surface and may contact the second dielectric layer 143 through an inner surface. The first dielectric layer 144 may include at least one of a ferroelectric material and an anti-ferroelectric material.

The ferroelectric material and the anti-ferroelectric material included in the first dielectric layer 144 may include at least one of, for example, hafnium (Hf), zirconium (Zr), silicon (Si), yttrium (Y), aluminum (Al), gadolinium (Gd), strontium (Sr), lanthanum (La), titanium (Ti), and oxides thereof. For example, the ferroelectric material and the anti-ferroelectric material may include, but are not limited to, at least one of hafnium oxide ($HfO_2$), zirconium oxide ($ZrO_2$), and hafnium zirconium oxide (HZO). The first dielectric layer 144 may include a single layer or multiple layers including different materials.

When the first dielectric layer 144 includes a ferroelectric material, the first dielectric layer 144 may have a relatively large dielectric constant, and may form an electric dipole by ferroelectric polarization, which is spontaneous polarization. The first dielectric layer 144 may have a residual polarization due to a dipole even in the absence of an external magnetic field. When the first dielectric layer 144 includes an anti-ferroelectric material, the first dielectric layer 144 may have polarization characteristics when an external electric field is applied. Accordingly, during a program operation of the semiconductor device 100, a bias applied to the memory cell may be secured by the first dielectric layer 144 even if a program voltage is reduced. If the program voltage may be reduced, a breakdown voltage margin between the gate electrodes 130 may also be secured and lengths of the gate electrodes 130 in a Z-direction may be reduced or minimized, so that the degree of integration may be improved without defects in a process.

The second dielectric layer 143 may contact the first dielectric layer 144 through an outer surface thereof and may contact the first semiconductor layer 142 through an inner surface thereof. The second dielectric layer 143 may be an interlayer generated between the first dielectric layer 144 and the first semiconductor layer 142 when first dielectric layer 144 and the first semiconductor layer 142 are formed, or may be an intentionally inserted layer. The second dielectric layer 143 may include, for example, but not limited to, silicon oxide (SiO), silicon nitride (SiN), silicon oxynitride (SiON), or combinations thereof. The second dielectric layer 143 may include metal oxide (e.g., aluminum oxide ($Al_2O_3$)). The second dielectric layer 143 may improve durability of the semiconductor device 100.

The first semiconductor layer 142 may be in contact with the second dielectric layer 143 through an outer surface thereof and may contact the plate layer 101, the buried layer 145, and the second semiconductor layer 141 through an inner surface thereof. As illustrated in FIG. 3C, the first semiconductor layer 142 may extend along the channel hole and may contact an upper surface of the channel pad 146 at a lower end thereof. The first semiconductor layer 142 may cover a portion of the second dielectric layer 143. As illustrated in FIG. 3B, the first semiconductor layer 142 may have an upper surface positioned on the same level as that of the upper surfaces of the first dielectric layer 144, the second dielectric layer 143, and the intermediate insulating layer 102, and may include a bent portion. The first semiconductor layer 142 may be in contact with the plate layer 101 in an upper surface and a portion of an inner surface thereof.

In some example embodiments, the first semiconductor layer 142 may include an oxide semiconductor material. For example, the first semiconductor layer 142 may include an oxide including at least one of indium (In), zinc (Zn), and gallium (Ga). For example, the first semiconductor layer 142 may include at least one of zinc tin oxide (ZTO), indium zinc oxide (IZO), ZnO, indium gallium zinc oxide (IGZO), indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), zinc tin oxide (ZnSnO), aluminum zinc tin oxide (AlZnSnO), gallium zinc tin oxide (GaZnSnO), and zirconium zinc tin oxide (ZrZnSnO). However, the material constituting the first semiconductor layer 142 is not limited thereto. In other example embodiments, the first semiconductor layer 142 may include a semiconductor material (e.g., polycrystalline silicon or monocrystalline silicon).

The second semiconductor layer 141 may contact the first semiconductor layer 142 through an outer surface thereof and may contact the buried layer 145 through an inner surface and an upper surface thereof.

As illustrated in FIG. 3B, the second semiconductor layer 141 may have an upper surface positioned at a level lower than the upper surface of the first semiconductor layer 142, the second dielectric layer 143, the first dielectric layer 144, and the intermediate insulating layer 102. In some example embodiments, the second semiconductor layer 141 may be positioned at a level lower than or equal to a lower surface of the uppermost gate electrode (i.e., the lower gate electrode 130L) among the gate electrodes and may be positioned at a level higher than or equal to an upper surface of the second uppermost gate electrode (e.g., the memory gate electrode 130M). Accordingly, the first semiconductor layer 142 may be disposed and the second semiconductor layer 141 may not be disposed on the side surface of the lower gate electrode 130L in the X-direction. By controlling the thickness of the semiconductor layer disposed on the side surface of the lower gate electrode 130L in the X-direction to be thin, a leakage current may be reduced, thereby improving controllability of the semiconductor device 100.

As illustrated in FIG. 3C, the second semiconductor layer 141 may extend along the channel hole and contact an upper surface of the channel pad 146 at a lower end thereof.

The second semiconductor layer 141 may include the same or a different material to that of the first semiconductor layer 142. In some example embodiments, the first semiconductor layer 142 may include an oxide semiconductor material, and the second semiconductor layer 141 may include polycrystalline silicon. In other example embodiments, the first semiconductor layer 142 and the second semiconductor layer 141 may include polycrystalline silicon.

The buried layer 145 may fill inner spaces of the first semiconductor layer 142 and the second semiconductor layer 141 in the channel hole. The buried layer 145 may not extend to the lower end of the channel structure CH, but may extend to the upper surface of the channel pad 146. The buried layer 145 may include a first portion surrounded by the first semiconductor layer 142 and a second portion surrounded by the second semiconductor layer 141. The buried layer 145 may have a first diameter in the first portion and a second diameter smaller than the first diameter in the second portion. An upper surface of the buried layer 145 may be higher than an upper surface of the lower gate electrode 130L. The buried layer 145 may include an insulating material.

The channel pad 146 may be disposed only at a lower end of the lower second channel structure CH2. The channel pad 146 may be disposed inside the first dielectric layer 144 and the second dielectric layer 143 at the lower end of the second channel structure CH to be in contact with the lower ends of the first semiconductor layer 142 and the second semiconductor layer 141. The channel pad 146 may include, for example, doped polycrystalline silicon. However, in some example embodiments, each of the first and second channel structures CH1 and CH2 may include the channel pad 146. In this case, the channel pad of the first channel structure CH1 may be connected to the first semiconductor layer 142 and the second semiconductor layer 141 of the second channel structure CH2.

The first dielectric layer 144, the second dielectric layer 143, the first semiconductor layer 142, and the second semiconductor layer 141 may be connected between the first channel structure CH1 and the second channel structure CH2. As illustrated in FIG. 3, an interlayer insulating layer 120 having a relatively thick thickness may be further disposed between the first channel structure CH1 and the second channel structure CH2. However, the shape of the interlayer insulating layers 120 may be variously changed in some example embodiments.

The first and second separation regions MS1, MS2*a*, and MS2*b* may extend in the X-direction through the gate electrodes 130. The first and second separation regions MS1, MS2*a*, and MS2*b* may be parallel to each other. The first and second separation regions MS1, MS2*a*, and MS2*b* may pass through the entire gate electrodes 130 stacked on the plate layer 101, and may be connected to the plate layer 101. The first separation regions MS1 may extend in one layer in the X-direction, and the second separation regions MS2*a* and MS2*b* may intermittently extend between the pair of first separation regions MS1, or may be disposed only in a partial region. For example, the second separation regions MS2*a* and MS2*b* may include second central separation regions MS2*a* and second auxiliary separation regions MS2*b* disposed between the first separation region MS1 and the second central separation regions MS2*a*. The second central separation regions MS2*a* may be disposed over the first region R1 and the second region R2, and the second auxiliary separation regions MS2*b* may be disposed only in the second region R2. The second central separation regions MS2*a* may be spaced apart from each other in the X-direction in the second region R2. According to some example embodiments, a shape in which the second separation regions MS2*a* and MS2*b* are spaced apart from each other in the second region R2 may be variously changed. Also, in some example embodiments, the arrangement order and number of the first and second separation regions MS1, MS2*a*, and MS2*b* are not limited to those illustrated in FIG. 1.

Referring to FIG. 2B, a separation insulating layer 105 may be disposed in the first and second separation regions MS1, MS2*a*, and MS2*b*. The separation insulating layer 105 may have a width decreasing toward the plate layer 101 due to a high aspect ratio, but is not limited thereto. In some example embodiments, a conductive layer may be further disposed in the separation insulating layer 105 in the first and second separation regions MS1, MS2*a*, and MS2*b*. In this case, the conductive layer may function as a common source line of the semiconductor device 100 or a contact plug connected to the common source line.

As illustrated in FIG. 1, the insulating regions SS may extend in the X-direction between the first separation region MS1 and the second central separation region MS2*a* and between the second central separation regions MS2*a* in the first region R1. The insulating regions SS may pass through a portion of the gate electrodes 130 including the lowermost upper gate electrode 130U among the gate electrodes 130. As illustrated in FIG. 2B, the insulating regions SS may separate a total of three gate electrodes 130 including the upper gate electrodes 130U in the Y-direction from each other. However, the number of gate electrodes 130 separated by the insulating regions SS may be variously changed in some example embodiments. The upper gate electrodes 130U separated by the insulating regions SS may form different string selection lines.

A second insulating layer 103 may be disposed in the insulating regions SS. The second insulating layer 103 may include an insulating material, for example, silicon oxide, silicon nitride, or silicon oxynitride.

The cell region insulating layer 190 may cover the plate layer 101, the intermediate insulating layer 102 on the lower surface of the plate layer 101, and the gate electrodes 130 on the lower surface of the intermediate insulating layer 102. The cell region insulating layer 190 may be formed of an insulating material, and may include a plurality of insulating layers.

The second interconnection structure may include gate contacts 160, a substrate contact 165, cell contact plugs 170, and cell interconnection lines 180, and electrically connect the second substrate structure S2 to the first substrate structure S1.

The gate contacts 160 may pass through the cell region insulating layer 190 to be connected to the gate electrodes 130. The substrate contact 165 may be connected to the plate layer 101.

The cell contact plugs 170 may include first to third cell contact plugs 172, 174, and 176, and the cell interconnection lines 180 may include first and second cell interconnection lines 182 and 184. The channel pads 146, the gate contacts 160, and the substrate contact 165 may be connected to the first cell contact plugs 172 at a lower end thereof. The first cell contact plugs 172 may be connected to the second cell contact plugs 174 at a lower end thereof, and the second cell contact plugs 174 may be connected to the first cell interconnection lines 182 at a lower end thereof. The third cell contact plugs 176 may vertically connect the first and second cell interconnection lines 182 and 184 to each other. The cell contact plugs 170 may have a cylindrical shape. The cell contact plugs 170 may have different lengths. For example, the first cell contact plugs 172 may have a relatively long length. In some example embodiments, the cell contact plugs 170 may have inclined side surfaces having a width narrowing toward the plate layer 101 and increasing toward the first substrate structure S1 according to the aspect ratio. In some example embodiments, some of the cell contact plugs 170 may be dummy contact plugs to which an electrical signal is not applied.

The first cell interconnection lines 182 may include bit lines of the first region R1 connected to the channel structures CH and the interconnection lines of the second region R2 disposed at a level at the same height as that of the bit lines. The second cell interconnection lines 184 may be interconnection lines disposed below the first cell interconnection lines 182. The cell interconnection lines 180 may have a line shape extending in at least one direction. In some example embodiments, the second cell interconnection lines 184 may have a thickness thicker than that of the first cell interconnection lines 182. The cell interconnection lines 180 may have inclined side surfaces having a width narrowing toward the plate layer 101.

The gate contacts 160, the substrate contact 165, the cell contact plugs 170, and the cell interconnection lines 180 may include, for example, tungsten (W), aluminum (Al), copper (Cu), tungsten nitride (WN), tantalum nitride (TaN), titanium nitride (TiN), or combinations thereof.

The second substrate structure S2 may further include through-vias passing through the plate layer 101 and connected to the lower second interconnection structure in a region not illustrated.

The second bonding vias 195 of the second bonding structure may be disposed below the second cell interconnection lines 184 and connected to the second cell interconnection lines 184. The second bonding layers 198 of the second bonding structure may be connected to the second bonding vias 195. Lower surfaces of the second bonding layers 198 may be exposed to a lower surface of the second substrate structure S2. The second bonding layers 198 may be bonded and connected to the first bonding layers 298 of the first substrate structure S1. The second bonding vias 195 and the second bonding layers 198 may include a conductive material, for example, copper (Cu).

In some example embodiments, the cell region insulating layer 190 may include a bonding insulating layer having a desired (or alternatively, predetermined) thickness from a lower surface thereof. In this case, the bonding insulating layer may form dielectric-dielectric bonding with the bonding insulating layer of the first substrate structure S1. The bonding insulating layer may include, for example, at least one of SiO, SiN, SiCN, SiOC, SiON, and SiOCN.

The first and second substrate structures S1 and S2 may be bonded by bonding the first bonding layers 298 and the second bonding layers 198 and bonding the bonding insulating layers (not shown). The bonding of the first bonding layers 298 and the second bonding layers 198 may be, for example, copper (Cu)-copper (Cu) bonding, and the bonding of the bonding insulating layers may be, for example, dielectric-dielectric bonding such as SiCN—SiCN bonding. The first and second substrate structures S1 and S2 may be bonded by hybrid bonding including copper (Cu)-copper (Cu) bonding and dielectric-dielectric bonding.

FIGS. 4 to 8 are partially enlarged views illustrating semiconductor devices according to some example embodiments. FIGS. 4 to 8 illustrate a region corresponding to FIG. 3B.

Figure 4:
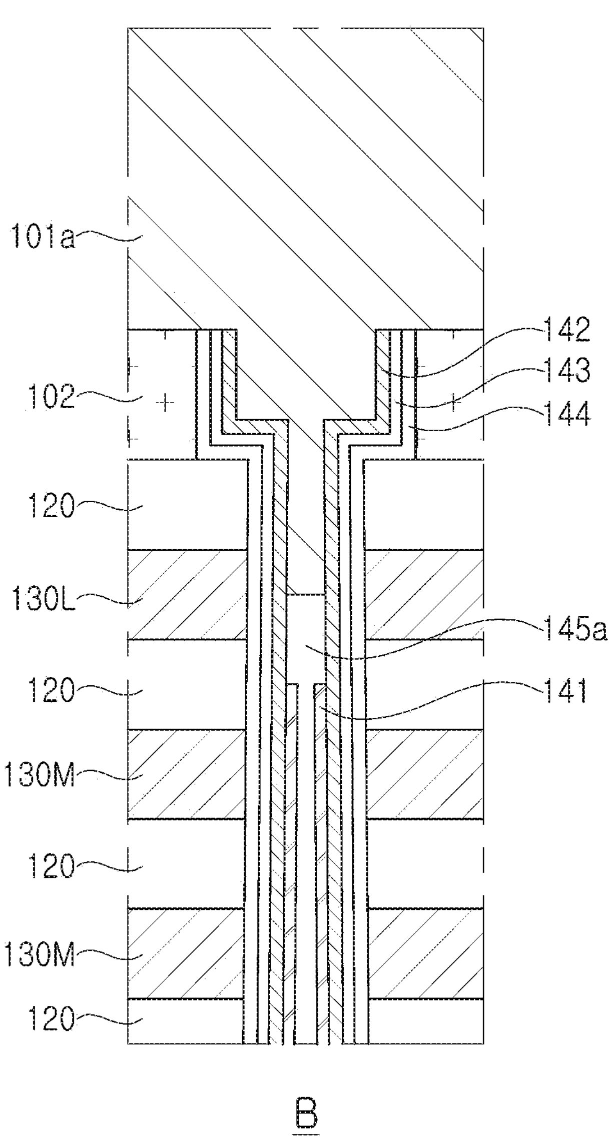
FIG. 4 is a partially enlarged view of a semiconductor device according to an example embodiment.

Referring to FIG. 4, in a semiconductor device 100*a*, a protrusion of a plate layer 101*a* may extend in the length direction of a channel hole to include a portion extending between the stack structures 120 and 130. The lowermost end of the protrusion of the plate layer 101*a* may be positioned, for example, at a level between upper and lower surfaces of the lower gate electrode 130L.

The lowermost end of the protrusion of the plate layer 101*a* may contact an upper surface of a buried layer 145*a*. The upper surface of the buried layer 145*a* may be positioned at the same level as that of the lowermost end of the protrusion (e.g., at a level between the upper and lower surfaces of the lower gate electrode 130L). As the protrusion of the plate layer 101*a* has the shape illustrated in FIG. 4, a contact area with the first semiconductor layer 142 may be increased.

Figure 5:
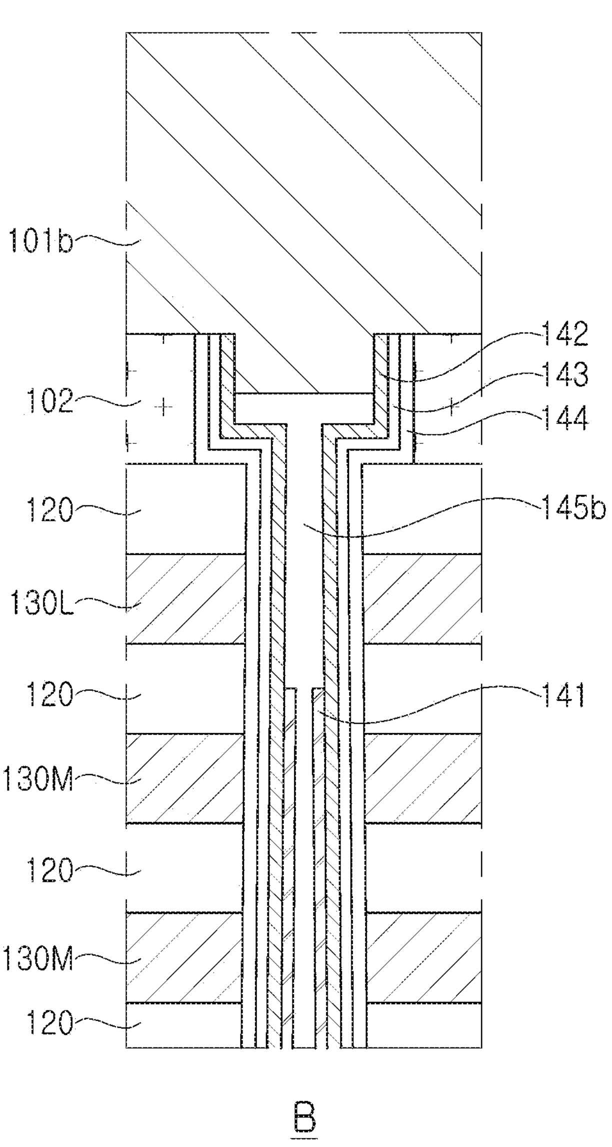
FIG. 5 is a partially enlarged view of a semiconductor device according to an example embodiment.

Referring to FIG. 5, in a semiconductor device 100*b*, a protrusion of the plate layer 101*b* may be disposed between the intermediate insulating layers 102 (e.g., at a level between upper and lower surfaces of the intermediate insulating layers 102). The lowermost end of the protrusion of the plate layer 101*b* may be positioned, for example, at a level between the lower surface and the upper surface of the intermediate insulating layer 102. The protrusion of the plate layer 101*b* may contact the first semiconductor layer 142 stacked to be parallel to a side surface of the intermediate insulating layer 102 in the X-direction.

The lowermost end of the protrusion of the plate layer 101*b* may contact the upper surface of the buried layer 145*b*. Accordingly, the upper surface of the buried layer 145*b* may be positioned at the same level as the lowermost end of the protrusion (e.g., at a level between the lower surface and the upper surface of the intermediate insulating layer 102). The buried layer 145*b* may include a portion disposed between the intermediate insulating layers 102 and may have an increased width between the intermediate insulating layers 102.

Figure 6:
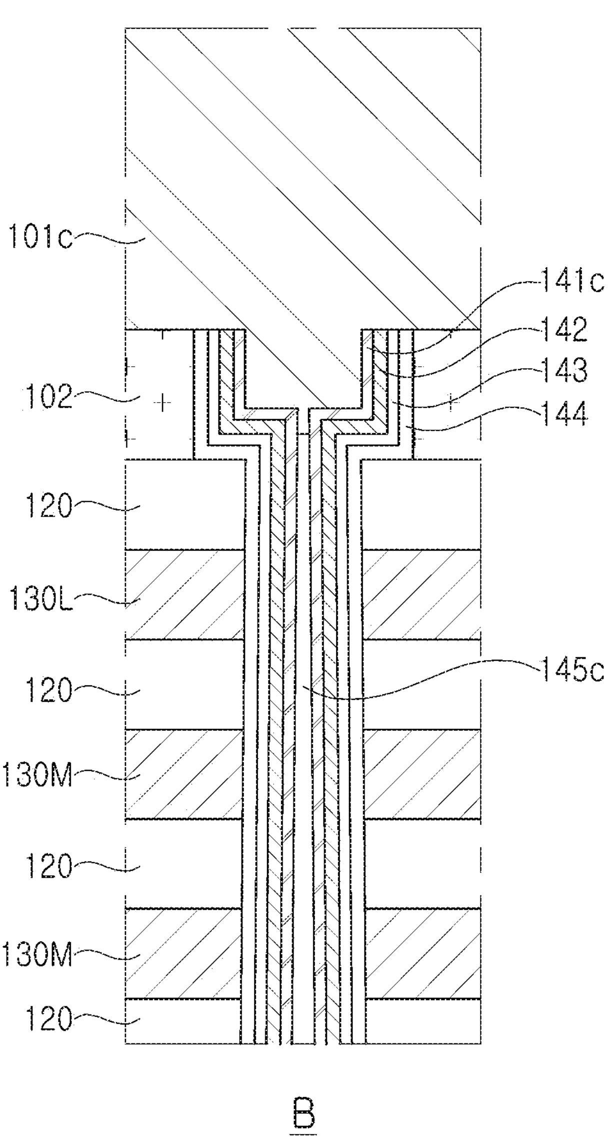
FIG. 6 is a partially enlarged view of a semiconductor device according to an example embodiment.

Referring to FIG. 6, in a semiconductor device 100*c*, a second semiconductor layer 141*c* may be disposed on the first semiconductor layer 142 to cover the entire inner surface of the first semiconductor layer 142. Accordingly, an upper surface of the second semiconductor layer 141*c* may be positioned at the same level as upper surfaces of the first semiconductor layer 142, the second dielectric layer 143, the first dielectric layer 144, and the intermediate insulating layer 102. The buried layer 145*c* may be surrounded by the second semiconductor layer 141*c*.

A plate layer 101*c* may include a protrusion in contact with the second semiconductor layer 141*c*. The protrusion of the plate layer 101*c* may be surrounded by the second semiconductor layer 141*c* and may be in contact with the buried layer 145*c* at the lowermost end thereof. As illustrated in FIG. 6, the protrusion of the plate layer 101*c* may include a portion extending to a level lower than the upper surface of the first semiconductor layer 142 that is parallel to the upper surface of the stack structures 120 and 130. In the extended portion, the protrusion may have a reduced width (diameter). However, a shape of the protrusion of the plate layer 101*c* is not limited thereto. For example, the protrusion of the plate layer 101*c* may have a uniform width (diameter).

Figure 7:
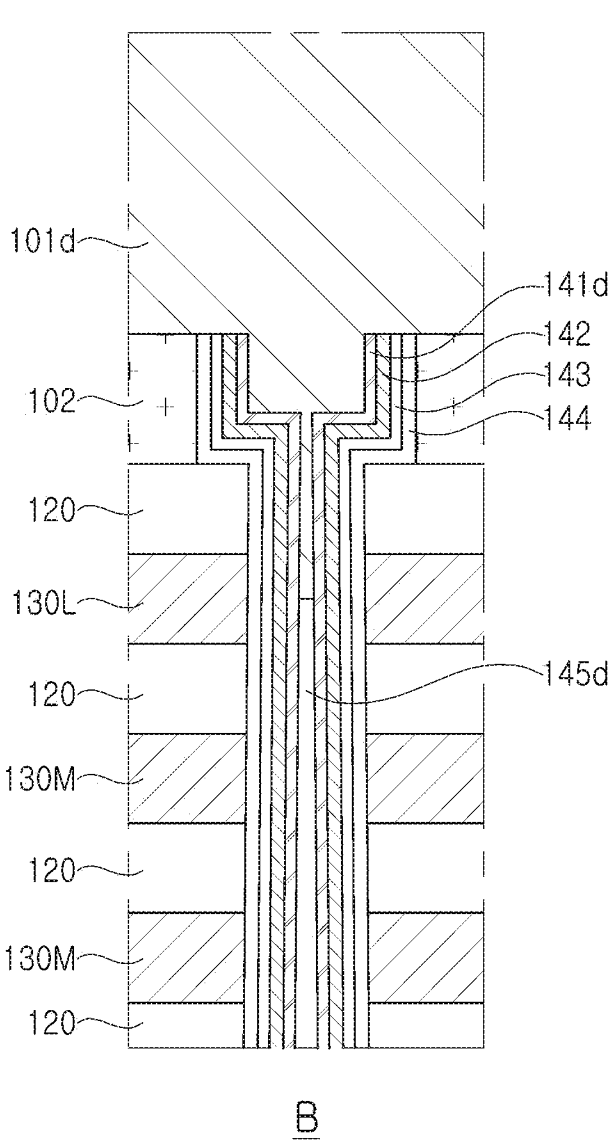
FIG. 7 is a partially enlarged view of a semiconductor device according to an example embodiment.

Referring to FIG. 7, in a semiconductor device 100*d*, a second semiconductor layer 141*d* may be disposed on the first semiconductor layer 142 to cover the entire inner surface of the first semiconductor layer 142. Accordingly, an upper surface of the second semiconductor layer 141*d* may be positioned substantially at the same level as the upper surfaces of the first semiconductor layer 142, the second dielectric layer 143, the first dielectric layer 144, and the intermediate insulating layer 102.

A plate layer 101*d* may include a protrusion in contact with the second semiconductor layer 141*d*. The protrusion of the plate layer 101*d* may extend in a length direction of the channel structure. The lowermost end of the protrusion of the plate layer 101*d* may be positioned at a level between the lower surface and the upper surface of the lower gate electrode 130L. A buried layer 145*d* may include an upper surface in contact with a lower surface of the plate layer 101*d*. Accordingly, the upper surface of the buried layer 145*d* may be positioned at the same level as the lowermost end of the protrusion (e.g., at a level between the lower surface and the upper surface of the lower gate electrode 130L).

Figure 8:
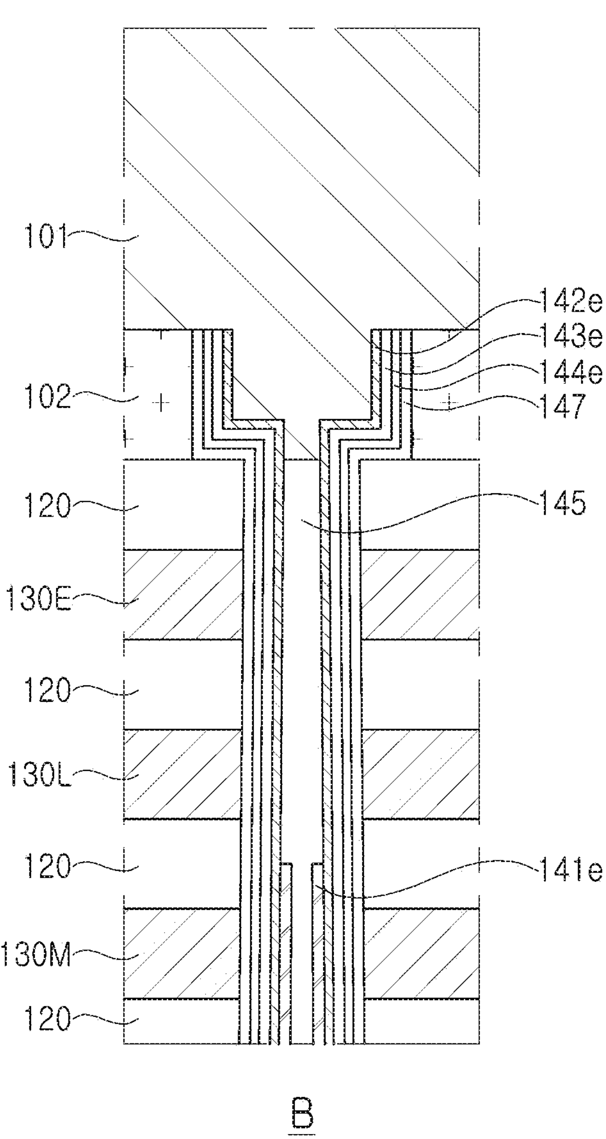
FIG. 8 is a partially enlarged view of a semiconductor device according to an example embodiment.

Referring to FIG. 8, in a semiconductor device 100*e*, a channel structure may include a blocking layer 147, a data storage layer 144*e*, a tunneling layer 143*e*, a first semiconductor layer 142*e*, and a second semiconductor layer 141*e* that are sequentially disposed on the gate electrodes. The blocking layer 147 may include silicon oxide (SiO), silicon nitride (SiN), silicon oxynitride (SiON), a high-k dielectric material, or combinations thereof. The data storage layer 144*e* may be a charge trap layer or a floating gate conductive layer. The tunneling layer 143*e* may tunnel charges into the data storage layer 144*e*, and may include, for example, silicon oxide ($SiO_2$), silicon nitride ($Si_3N_4$), silicon oxynitride (SiON), or combinations thereof.

The gate electrodes may further include an erase gate electrode 130E disposed on the lower gate electrode 130L. The erase gate electrode 130E may be used for an erase operation using a gate induced drain leakage (GIDL) phenomenon. In some example embodiments, the erase gate electrode 130E may also be disposed below the upper gate electrodes 130U of FIG. 2A.

The second semiconductor layer 141*e* may cover a portion of an inner surface of the first semiconductor layer 142*e*. An upper surface of the second semiconductor layer 141*e* may be disposed at a level equal to or lower than the lower surface of the lower gate electrode 130L, and may be at a level higher than or equal to the upper surface of the memory gate electrode 130M disposed below the lower gate electrode 130L. The second semiconductor layer 141*e* may not be disposed on side surfaces of the erase gate electrode 130E and the lower gate electrode 130L in the X-direction. By controlling the thickness of the semiconductor layer on the side surface of the lower gate electrode 130L to be thin, leakage current may be improved and controllability of the semiconductor device 100*e* may be improved.

However, the structure and shape of the semiconductor layer are not limited to those described above. For example, the semiconductor device 100*e* may include a single semiconductor layer. In some example embodiments, the semiconductor device 100*e* may include the first semiconductor layer 142*e* and may not include the second semiconductor layer 141*e*. In this case, the first semiconductor layer 142*e* may include polycrystalline silicon.

Figure 9:
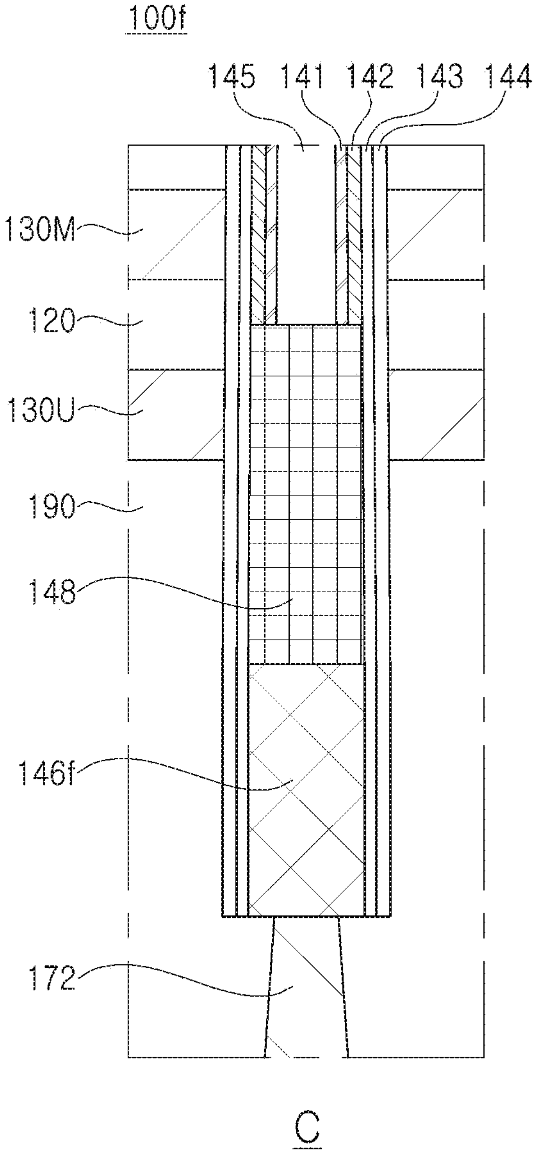
FIG. 9 is a partially enlarged view of a semiconductor device according to an example embodiment.

FIG. 9 is a partial enlarged view illustrating a semiconductor device according to an example embodiment. FIG. 9 illustrates a region corresponding to FIG. 3C.

Referring to FIG. 9, in a semiconductor device 100*f*, the channel structure may further include a third semiconductor layer 148 disposed between a channel pad 146*f* and the buried layer 145. In some example embodiments, the third semiconductor layer 148 may include an undoped semiconductor layer or a p-type semiconductor layer, and the channel pad 146*f* may include an n-type semiconductor layer. An upper surface of the third semiconductor layer 148 may contact lower ends of the first semiconductor layer 142 and the second semiconductor layer 141. A side surface of the third semiconductor layer 148 may be surrounded by the second dielectric layer 143.

A lower surface of the third semiconductor layer 148 may be positioned at a level lower than the lower surface of the upper gate electrode 130U, and an upper surface of the third semiconductor layer 148 may be positioned at a level higher than the upper surface of the upper gate electrode 130U.

FIGS. 10 to 17 are schematic views illustrating a method of manufacturing the semiconductor device 100 illustrated in FIGS. 1 to 3C, according to an example embodiment.

FIGS. 10, 11A, 13, 14, and 15A are cross-sectional views illustrating a region corresponding to FIG. 2A, and FIGS. 11B, 12, 15B, 16, and 17 are partially enlarged views illustrating a region corresponding to FIG. 3B.

Figure 10:
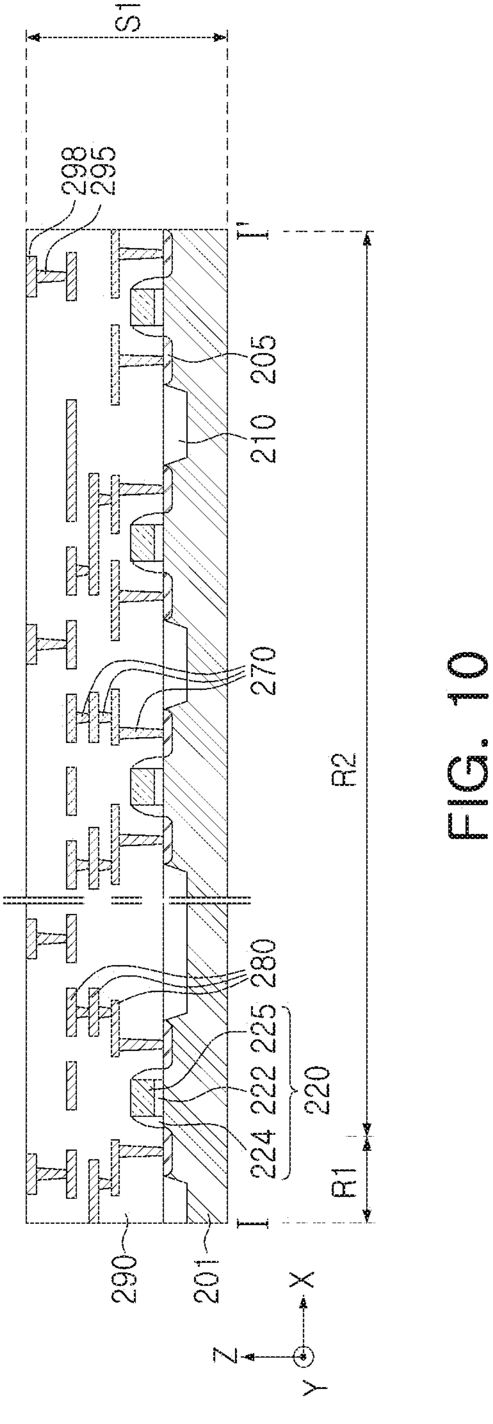
FIGS. 10, 11A, 11B, 12 to 14, 15A, 15B, 16, and 17 are schematic views illustrating a method of manufacturing a semiconductor device according to an example embodiment.

Referring to FIG. 10, a first substrate structure S1 including circuit elements 220, first interconnection structures, and a first bonding structure may be formed on a substrate 201.

First, device separation layers 210 may be formed in the substrate 201, and a circuit gate dielectric layer 222 and a circuit gate electrode 225 may be sequentially formed on the substrate 201. The device separation layers 210 may be formed by, for example, a shallow trench isolation (STI) process. The circuit gate dielectric layer 222 and the circuit gate electrode 225 may be formed using atomic layer deposition (ALD) or chemical vapor deposition (CVD). The circuit gate dielectric layer 222 may be formed of silicon oxide, and the circuit gate electrode 225 may be formed of at least one of polycrystalline silicon or a metal silicide layer, but is not limited thereto. Next, a spacer layer 224 and source/drain regions 205 may be formed on both sidewalls of the circuit gate dielectric layer 222 and the circuit gate electrode 225. In some example embodiments, the spacer layer 224 may include a plurality of layers. Thereafter, an ion implantation process may be performed to form the source/drain regions 205.

The circuit contact plugs 270 of the first interconnection structure and the first bonding vias 295 of the first bonding structure may be formed by forming a portion of the peripheral region insulating layer 290, performing etching to remove a portion, and then filling the removed portion with a conductive material. The circuit interconnection lines 280 of the first interconnection structure and the first bonding layers 298 of the first bonding structure may be formed, for example, by depositing a conductive material and then patterning the deposited conductive material. The first bonding layers 298 may be formed such that upper surfaces thereof are exposed through the peripheral region insulating layer 290.

The peripheral region insulating layer 290 may include a plurality of insulating layers. A portion of the peripheral region insulating layer 290 may be formed in each of the operations of forming the first interconnection structure and the first bonding structure. In this operation, the first substrate structure S1 may be prepared.

Figure 11A:
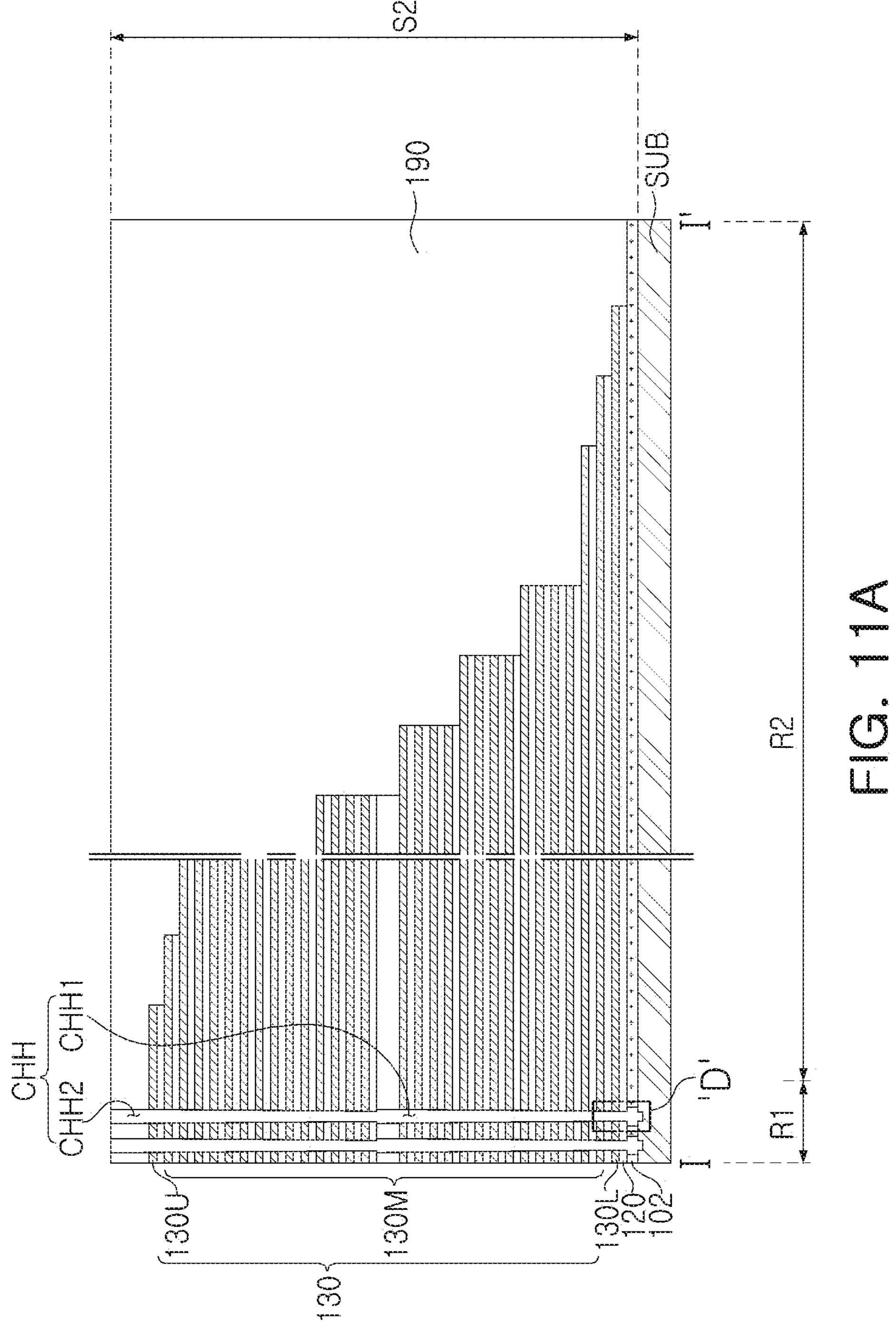

Referring to FIG. 11A, a manufacturing process of the second substrate structure S2 may be started. First, the intermediate insulating layer 102 may be formed on the base substrate SUB, the interlayer insulating layers 120 and the gate electrodes 130 may be alternately stacked, and then the channel hole CHH may be formed.

The base substrate SUB may be a semiconductor substrate such as silicon (Si), and may be removed in a subsequent process. The intermediate insulating layer 102 may be a layer including an insulating material (e.g., silicon nitride). The gate electrodes 130 may be alternately formed with the interlayer insulating layers 120 to form a lower stack structure and an upper stack structure. The gate electrodes 130 may include a semiconductor material (e.g., polycrystalline silicon), and the interlayer insulating layers 120 may include an insulating material (e.g., silicon oxide). In some example embodiments, the thicknesses of the interlayer insulating layers 120 may not all be the same.

Figure 11B:
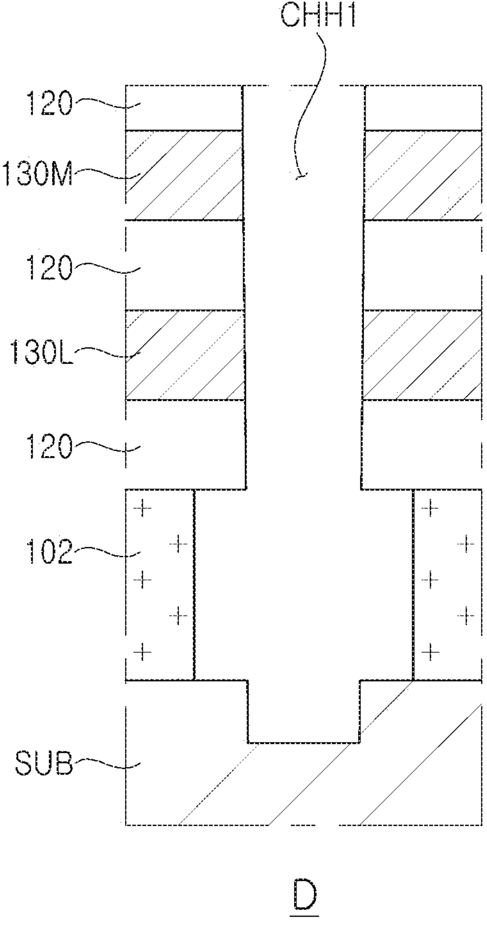

After the lower stack structure is formed and the first channel hole CHH1 is formed, the first channel hole CHH1 may be filled with a sacrificial material. Referring to FIG. 11B, which is an enlarged view of region 'D' of FIG. 11A, the first channel hole CHH1 may have an enlarged region at a level of the intermediate insulating layer 102. After forming a channel hole having a continuous diameter in the lower stack structure, the channel hole may be enlarged at the level of the intermediate insulating layer 102 to form a first channel hole CHH1 as illustrated in FIG. 11B.

Thereafter, an upper stack structure may be formed on the lower stack structure, and a second channel hole CHH2 may be formed. A sacrificial material filling the first channel hole CHH1 exposed through the second channel hole CHH2 may be removed. The first channel hole CHH1 and the second channel hole CHH2 formed accordingly may constitute the channel hole CHH. In a connection region of the first channel hole CHH1 and the second channel hole CHH2, a bent portion may be formed due to a difference or change in width.

Thereafter, a photolithography process and an etching process may be repeatedly performed on the gate electrodes 130 and the interlayer insulating layers 120 so that the upper gate electrodes 130 extend to be shorter than the lower gate electrodes 130. Accordingly, the gate electrodes 130 may form a step shape. In some example embodiments, the gate electrodes 130 may be formed to have a relatively thick thickness at the ends thereof, and a process therefor may be further performed. Thereafter, an insulating material covering an upper portion of the stack structure of the gate electrodes 130 and the interlayer insulating layers 120 may be deposited to further form a portion of cell region insulating layer 190.

Figure 12:
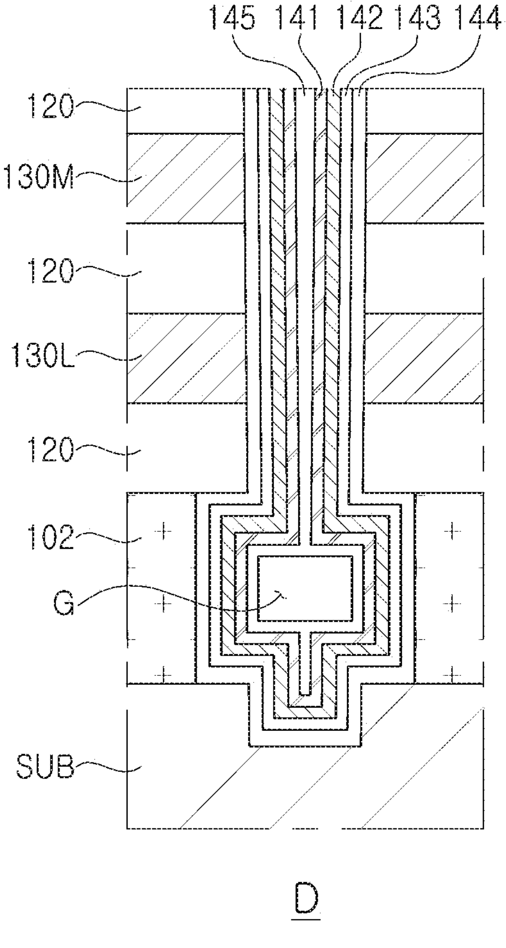

Referring to FIG. 12, the first dielectric layer 144, the second dielectric layer 143, the first semiconductor layer 142, the second semiconductor layer 141, and the buried layer 145 are sequentially formed from the gate electrodes, inside the channel hole.

The first dielectric layer 144, the second dielectric layer 143, the first semiconductor layer 142, the second semiconductor layer 141, and the buried layer 145 may be conformally formed to cover the inner surface of the channel hole inside the channel hole. A space G surrounded by the buried layer 145 in the enlarged region may be formed inside the channel hole.

Figure 13:
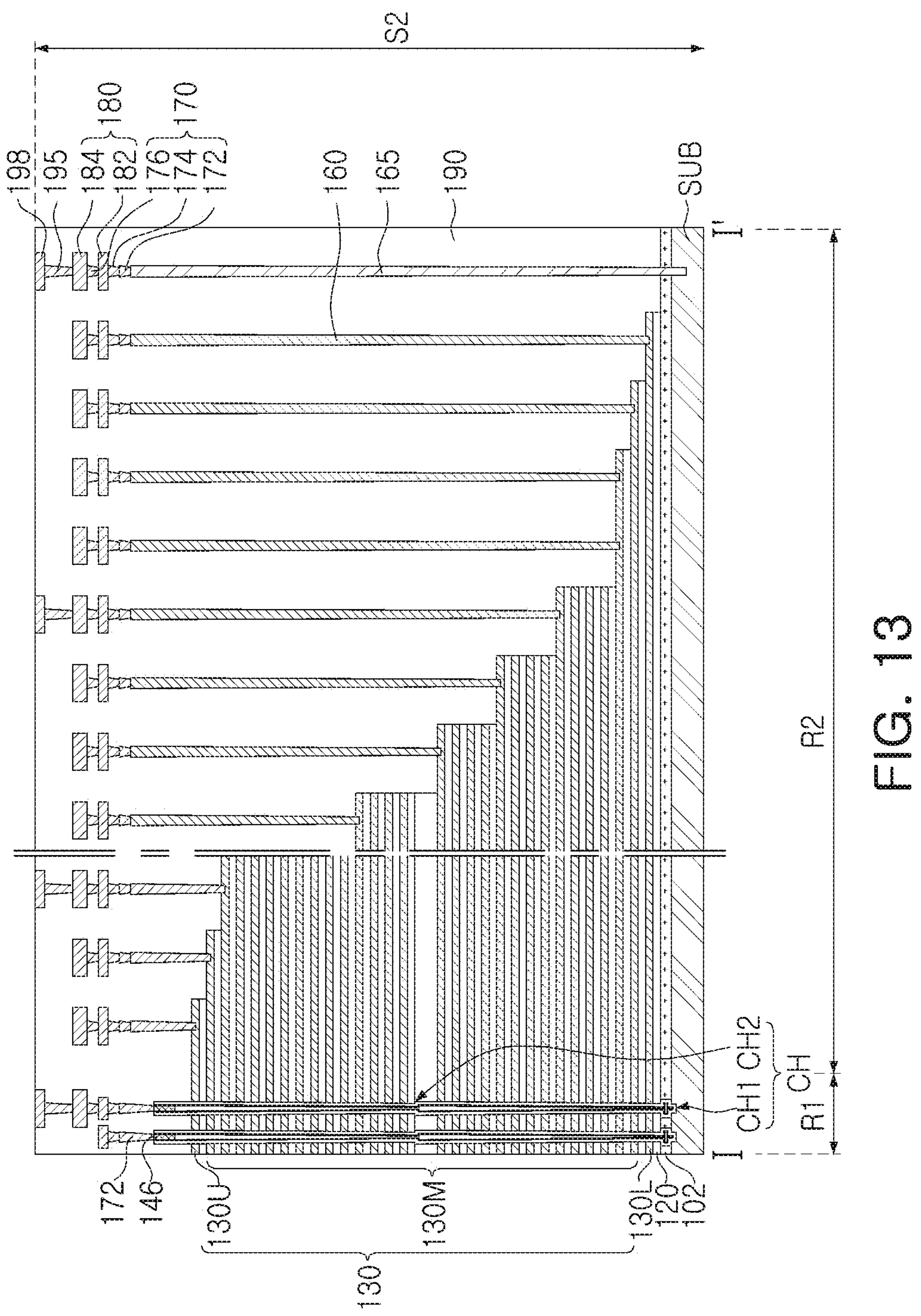

A portion of the first semiconductor layer 142, the second semiconductor layer 141, and the buried layer 145 at the upper end of the channel hole may be etched to form a channel pad (146 in FIG. 13). A side surface of the channel pad may be surrounded by the second dielectric layer 143, and a lower surface of the channel pad may be in contact with upper ends of the first semiconductor layer 142 and the second semiconductor layer 141.

Referring to FIG. 13, a second interconnection structure and a second bonding structure may be formed on the gate electrodes 130.

In the second interconnection structure, the gate contacts 160 and the substrate contact 165 may be formed by etching the cell region insulating layer 190 on the gate electrodes 130 and the base substrate SUB to form contact holes and then filling the contact holes with a conductive material. The cell contact plugs 170 may be formed by etching the cell region insulating layer 190 and depositing a conductive material on the channel pads 146, the gate contacts 160, and the substrate contact 165. The cell interconnection lines 180 may be formed through a process of depositing and patterning a conductive material, or may be formed by partially forming an insulating layer constituting the cell region insulating layer 190, patterning the formed insulating layer and then depositing a conductive material.

The second bonding vias 195 and the second bonding layers 198 constituting the second bonding structure may be formed by further forming the cell region insulating layer 190 on the cell interconnection lines 180 and then removing a portion thereof. An upper surface of the second bonding layers 198 may be exposed from the cell region insulating layer 190.

Figure 14:
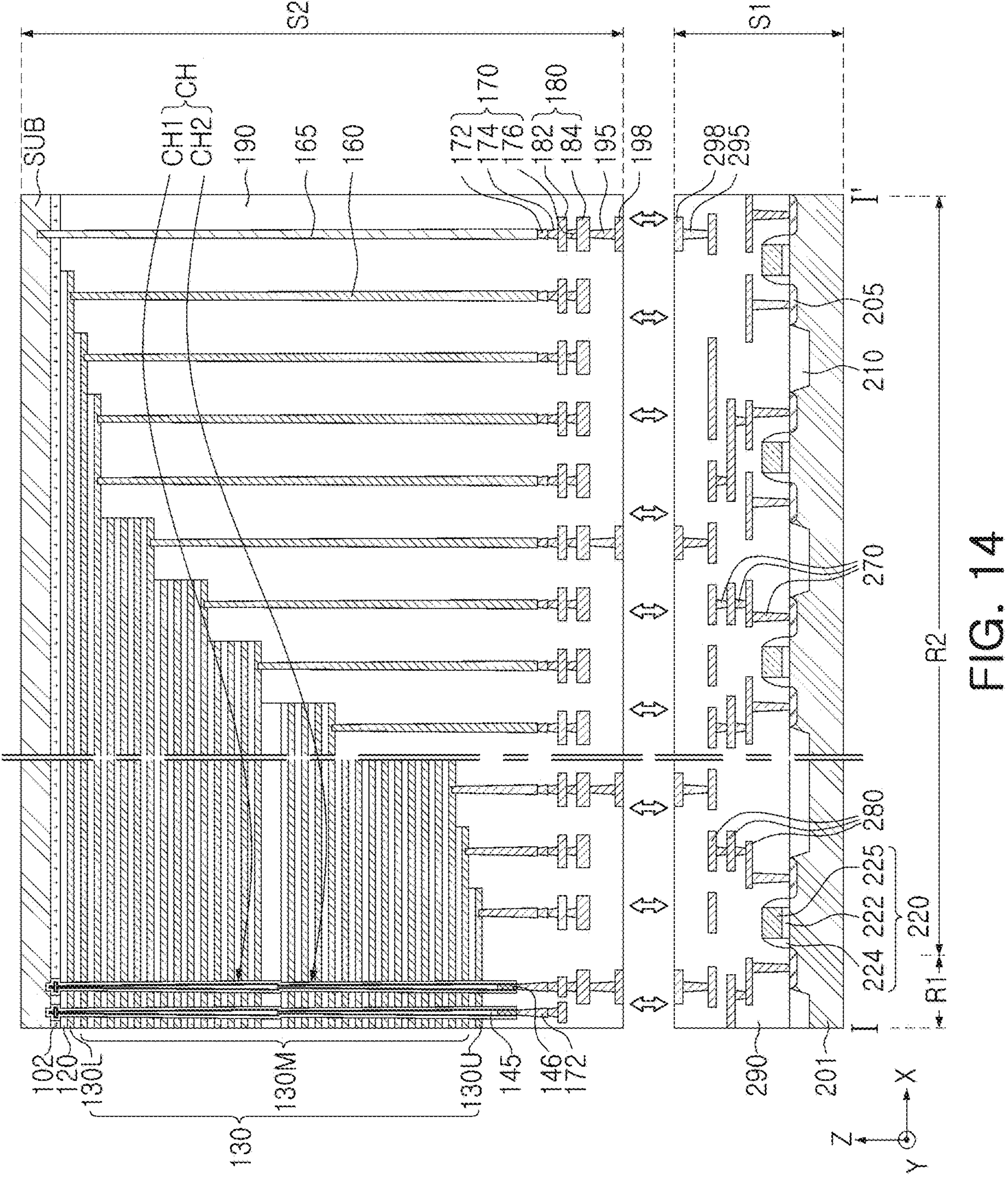

Referring to FIG. 14, the first substrate structure S1 and the second substrate structure S2 may be bonded.

The first substrate structure S1 and the second substrate structure S2 may be connected by bonding the first bonding layers 298 and the second bonding layers 198 by pressing. At the same time, the bonding insulating layers that are part of the peripheral region insulating layer 290 and the cell region insulating layer 190 may also be bonded by pressing. After the second substrate structure S2 is turned over on the first substrate structure S1 so that the second bonding layers 198 face downwardly, bonding may be performed. In the drawings, for better understanding, the second substrate structure S2 is illustrated to be bonded in a mirror image of the structure illustrated in FIG. 13.

The first substrate structure S1 and the second substrate structure S2 may be directly bonded without the intervening adhesive such as a separate adhesive layer. According to some example embodiments, before bonding, a surface treatment process (e.g., a hydrogen plasma treatment) may be further performed on the upper surface of the first substrate structure S1 and the lower surface of the second substrate structure S2 in order to strengthen bonding strength.

Figure 15A:
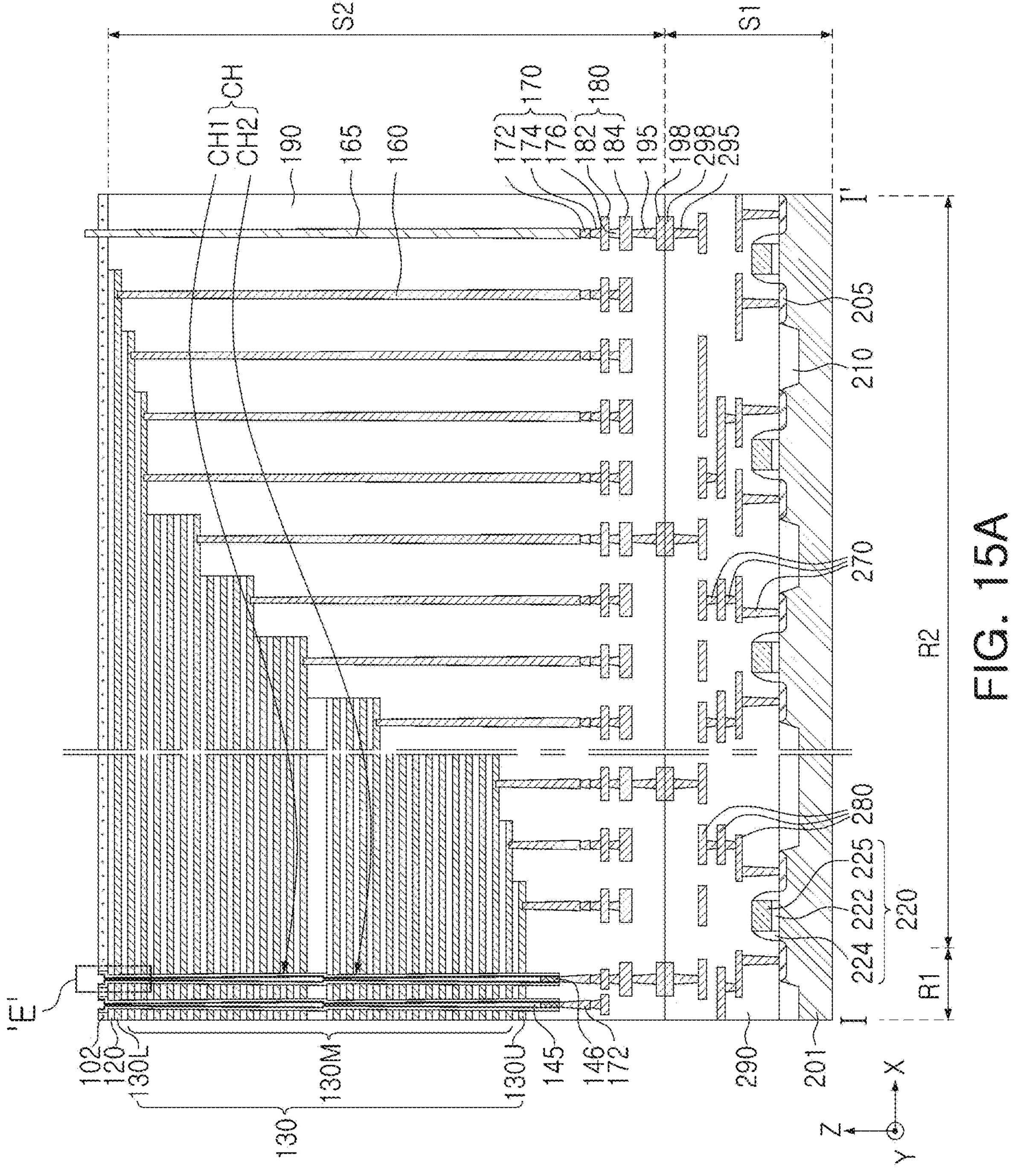

Referring to FIG. 15A, the base substrate (SUB of FIG. 14) may be removed. The base substrate may be removed by, for example, a planarization process. In some example embodiments, the planarization process may be chemical mechanical polishing (CMP).

Figure 15B:
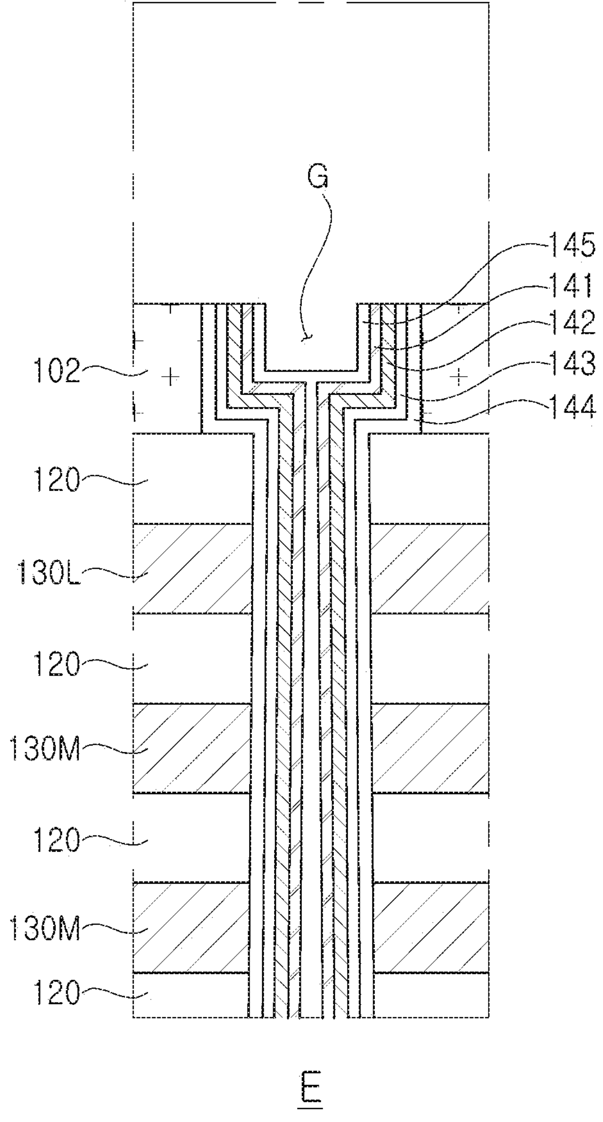

The intermediate insulating layer 102 may serve as a stopper layer during the planarization process. The intermediate insulating layer 102 allows the semiconductor device to have a flat upper surface. During the planarization process, an upper portion of the intermediate insulating layer 102 may be removed together. In addition, portions of the first dielectric layer 144, the second dielectric layer 143, the first semiconductor layer 142, the second semiconductor layer 141, and the buried layer 145 may be removed. Referring to FIG. 15B, which is an enlarged view of region 'E' of FIG. 15A, together, upper ends of the first dielectric layer 144, the second dielectric layer 143, the first semiconductor layer 142, the second semiconductor layer 141, and the buried layer 145 may be exposed at the top of the channel hole. The space G defined by the buried layer 145 at the level of the intermediate insulating layer 102 may also be exposed at the top of the channel hole.

A method of removing the base substrate is not limited to chemical mechanical polishing (CMP). In other example embodiments, a portion may be removed from the upper surface of the base substrate by a polishing process such as a grinding process, and a remaining portion of the base substrate and a portion of the intermediate insulating layer 102 may be removed by an etching process such as wet etching. In this case, the intermediate insulating layer 102 may be used as a stopper layer for the etching process. The remaining portion of the base substrate and the portion of the intermediate insulating layer 102 may be selectively etched with respect to the substrate contact 165 to expose at least a portion of the substrate contact 165.

Figure 16:
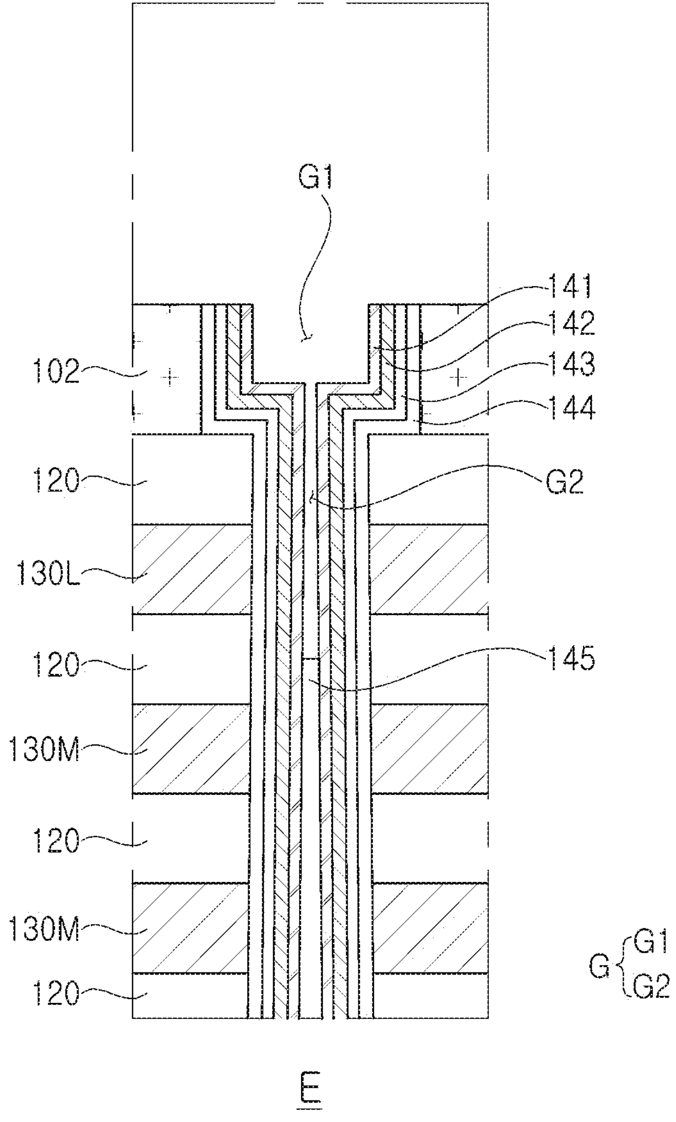

Referring to FIG. 16, a portion of the buried layer 145 may be removed. The buried layer 145 may be removed by, for example, a wet etching process.

The buried layer 145 may be etched to a level lower than the lower surface of the lower gate electrode layer 130L. The buried layer 145 may be etched, for example, to have an upper surface positioned at a level between a lower surface of the uppermost gate electrode (e.g., lower gate electrode layer 130L), among the gate electrodes, and an upper surface of the second uppermost gate electrode (e.g., the memory gate electrode 130M), among the gate electrodes. Accordingly, the channel structure may include a first space G1 formed at the upper end and a second space G2 formed below the first space G1 and having a width smaller than the first space G1. The first space G1 and the second space G2 may be continuously formed to constitute the space G in the channel structure.

Figure 17:
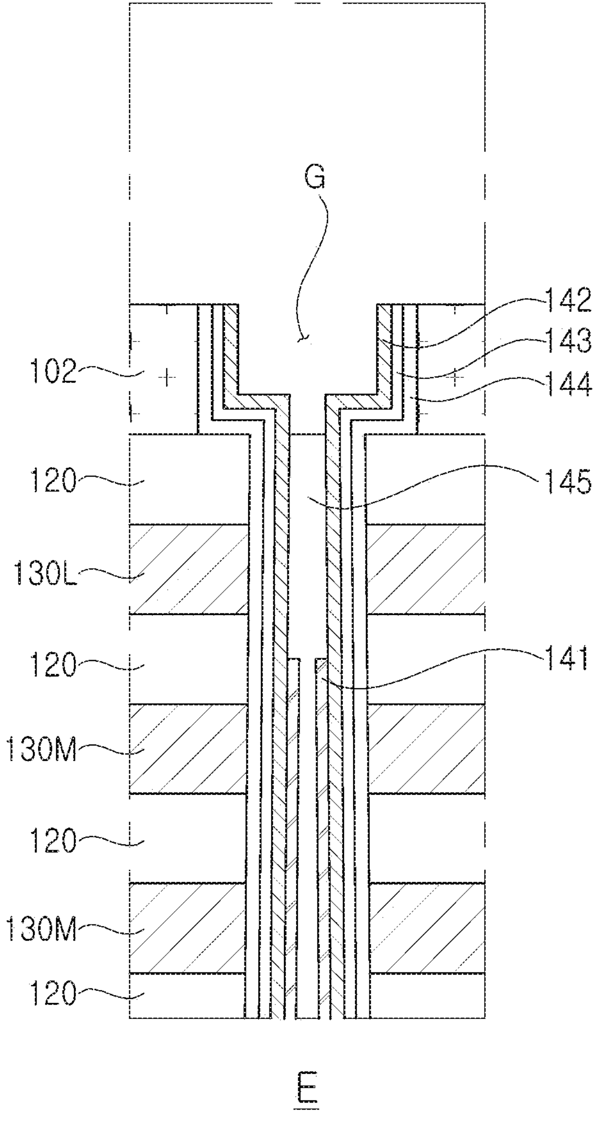

Referring to FIG. 17, the second semiconductor layer 141 may be removed to a level below the lower surface of the lower gate electrode 145L, and the space inside the channel structure may be filled with oxide to form the buried layer 145.

First, the second semiconductor layer 141 may be removed to the level of the upper surface of the buried layer 145 illustrated in FIG. 16. The second semiconductor layer 141 may be removed by, for example, a wet etching process. The second semiconductor layer 141 may be selectively removed up to the level of the upper surface of the buried layer 145 by injecting an etching solution into the empty space (G of FIG. 16) disposed at the upper end of the channel structure.

Thereafter, an oxide may be formed in the space inside the channel structure to form the buried layer 145. The buried layer 145 may contact the first semiconductor layer 142 and cover an upper end of the second semiconductor layer 141. The buried layer 145 may have, for example, an upper surface positioned substantially at the same level as the lower surface of the intermediate insulating layer 102. The buried layer 145 may have a relatively large width in a region surrounded by the first semiconductor layer 142 and may have a relatively small width in a region surrounded by the second semiconductor layer 141.

Thereafter, referring to FIGS. 2A, 2B, and 3B together, the plate layer 101 covering the intermediate insulating layer 102 and the channel structure may be formed. The plate layer 101 may include a semiconductor material, for example, polycrystalline silicon, and may further include impurities. The plate layer 101 may be formed by depositing polycrystalline silicon. In some example embodiments, the plate layer 101 may be formed by depositing a polycrystalline silicon film and the performing annealing thereon by irradiating a laser, etc. to melt and recrystallize silicon. Accordingly, the semiconductor device 100 of FIGS. 1 to 3C may be finally manufactured.

Figure 18:
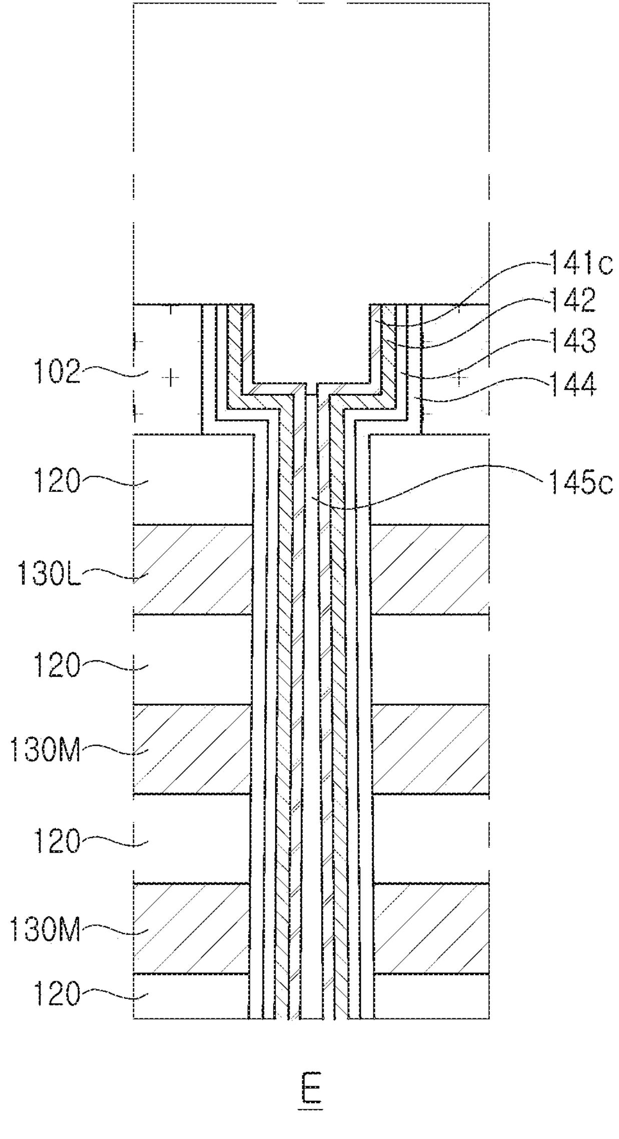
FIG. 18 is a partially enlarged view schematically illustrating a method of manufacturing a semiconductor device according to an example embodiment.

FIG. 18 is a partially enlarged view schematically illustrating a method of manufacturing the semiconductor device 100*c* illustrated in FIG. 6.

The manufacturing method of FIGS. 10 to 15B above may be performed in the same manner. Thereafter, as illustrated in FIG. 18, the buried layer 145*c* may be removed only to a level higher than the lower surface of the intermediate insulating layer 102. The buried layer 145*c* may be partially removed using, for example, a wet etching process.

Next, referring to FIG. 6, the semiconductor device 100*c* may be manufactured by forming the plate layer 101*c* covering the intermediate insulating layer 102 and the channel structure.

Figure 19:
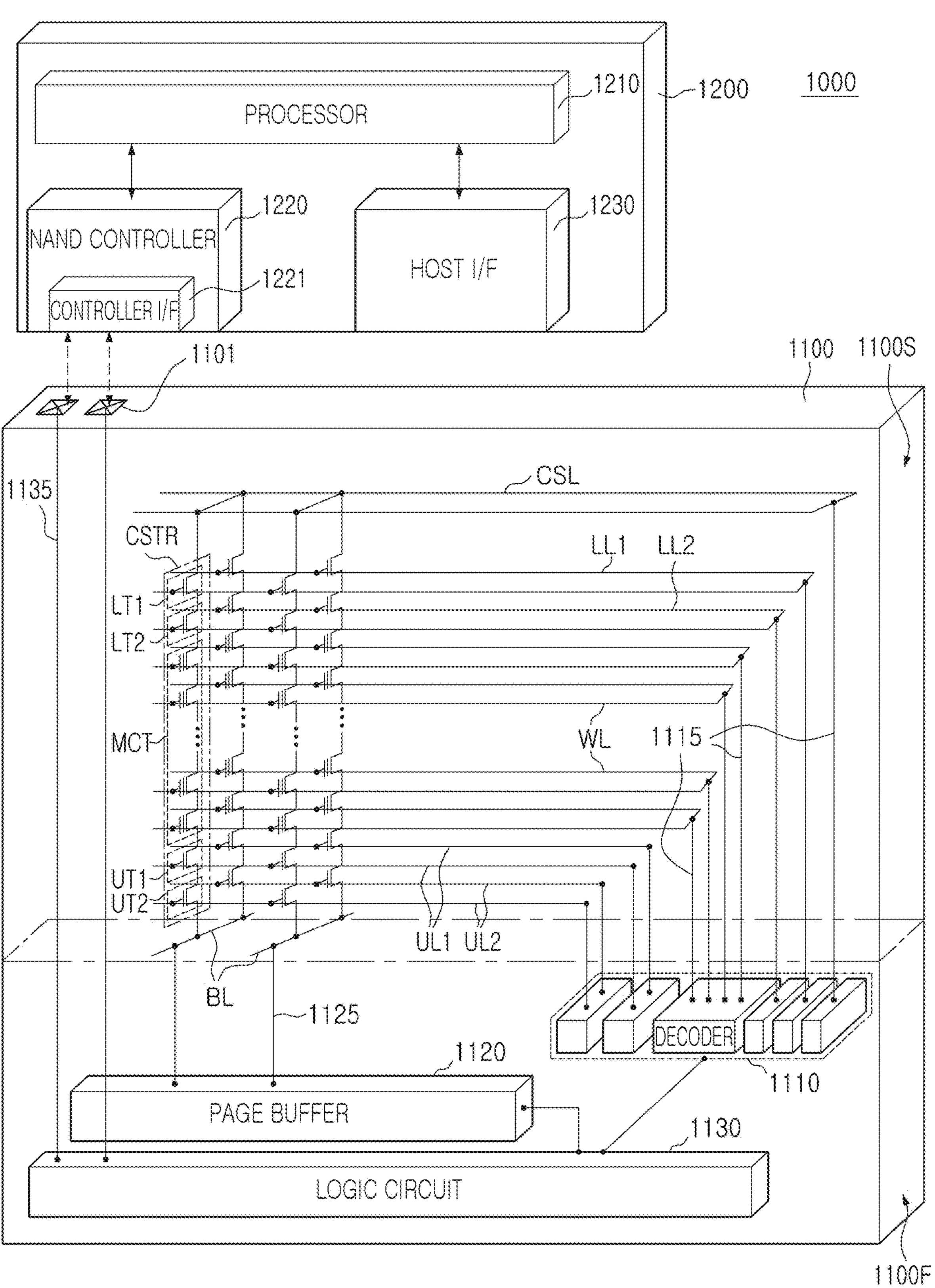
FIG. 19 is a diagram schematically illustrating an electronic system including a semiconductor device according to an example embodiment.

FIG. 19 is a diagram schematically illustrating an electronic system including a semiconductor device according to an example embodiment.

Referring to FIG. 19, the electronic system 1000 may include a semiconductor device 1100 and a controller 1200 electrically connected to the semiconductor device 1100. The electronic system 1000 may be a storage device including one or a plurality of semiconductor devices 1100 or an electronic device including a storage device. For example, the electronic system 1000 may be a solid state drive (SSD) device, a universal serial bus (USB), a computing system, a medical device, or a communication device including one or a plurality of semiconductor devices 1100.

The semiconductor device 1100 may be a nonvolatile memory device and may be, for example, the NAND flash memory device described above with reference to FIGS. 1 to 9. The semiconductor device 1100 may include a first semiconductor structure 1100F and a second semiconductor structure 1100S on the first semiconductor structure 1100F. In some example embodiments, the first semiconductor structure 1100F may be disposed next to the second semiconductor structure 1100S. The first semiconductor structure 1100F may be a peripheral circuit structure including a decoder circuit 1110, a page buffer 1120, and a logic circuit 1130. The second semiconductor structure 1100S may be a memory cell structure including a bit line BL, a common source line CSL, word lines WL, first and second gate upper lines UL1 and UL2, and memory cell strings CSTR between the bit line BL and the common source line CSL.

In the second semiconductor structure 1100S, each of the memory cell strings CSTR may include lower transistors LT1 and LT2 adjacent to the common source line CSL, and upper transistors UT1 and UT2 adjacent to the bit line BL, and a plurality of memory cell transistors MCT disposed between the lower transistors LT1 and LT2 and the upper transistors UT1 and UT2. The number of lower transistors LT1 and LT2 and the number of upper transistors UT1 and UT2 may be variously changed according to some example embodiments.

In some example embodiments, the upper transistors UT1 and UT2 may include a string select transistor, and the lower transistors LT1 and LT2 may include a ground select transistor. The gate lower lines LL1 and LL2 may be gate electrodes of the lower transistors LT1 and LT2, respectively. The word lines WL may be gate electrodes of the memory cell transistors MCT, and the gate upper lines UL1 and UL2 may be gate electrodes of the upper transistors UT1 and UT2, respectively.

In some example embodiments, the lower transistors LT1 and LT2 may include a lower erase control transistor LT1 and a ground select transistor LT2 connected in series. The upper transistors UT1 and UT2 may include a string select transistor UT1 and an upper erase control transistor UT2 connected in series. At least one of the lower erase control transistor LT1 and the upper erase control transistor UT1 may be used for an erase operation of erasing data stored in the memory cell transistors MCT using a GIDL phenomenon.

The common source line CSL, the first and second gate lower lines LL1 and LL2, the word lines WL, and the first and second gate upper lines UL1 and UL2 may be electrically connected to the decoder circuit 1110 through first connection wirings 1115 extending from within the first semiconductor structure 1100F to the second semiconductor structure 1100S. The bit lines BL may be electrically connected to the page buffer 1120 through second connection lines 1125 extending from within the first semiconductor structure 1100F to the second semiconductor structure 1100S.

In the first semiconductor structure 1100F, the decoder circuit 1110 and the page buffer 1120 may perform a control operation on at least one selected memory cell transistor among the plurality of memory cell transistors MCT. The decoder circuit 1110 and the page buffer 1120 may be controlled by the logic circuit 1130. The semiconductor device 1100 may communicate with the controller 1200 through an I/O pad 1101 electrically connected to the logic circuit 1130. The I/O pad 1101 may be electrically connected to the logic circuit 1130 through an I/O connection line 1135 extending from within the first semiconductor structure 1100F to the second semiconductor structure 1100S.

The controller 1200 may include a processor 1210, a NAND controller 1220, and a host interface (I/F) 1230. In some example embodiments, the electronic system 1000 may include a plurality of semiconductor devices 1100, and in this case, the controller 1200 may control the plurality of semiconductor devices 1100.

The processor 1210 may control an overall operation of the electronic system 1000 including the controller 1200. The processor 1210 may operate according to desired (or alternatively, predetermined) firmware, and may access the semiconductor device 1100 by controlling the NAND controller 1220. The NAND controller 1220 may include a controller IF 1221 that handles communication with the semiconductor device 1100. Through the controller I/F 1221, a control command for controlling the semiconductor device 1100, data to be written to the memory cell transistors MCT of the semiconductor device 1100, and data to be read from the memory cell transistors of the semiconductor device 1100 may be transmitted. The host I/F 1230 may provide a communication function between the electronic system 1000 and an external host. When a control command is received from an external host through the host I/F 1230, the processor 1210 may control the semiconductor device 1100 in response to the control command.

Figure 20:
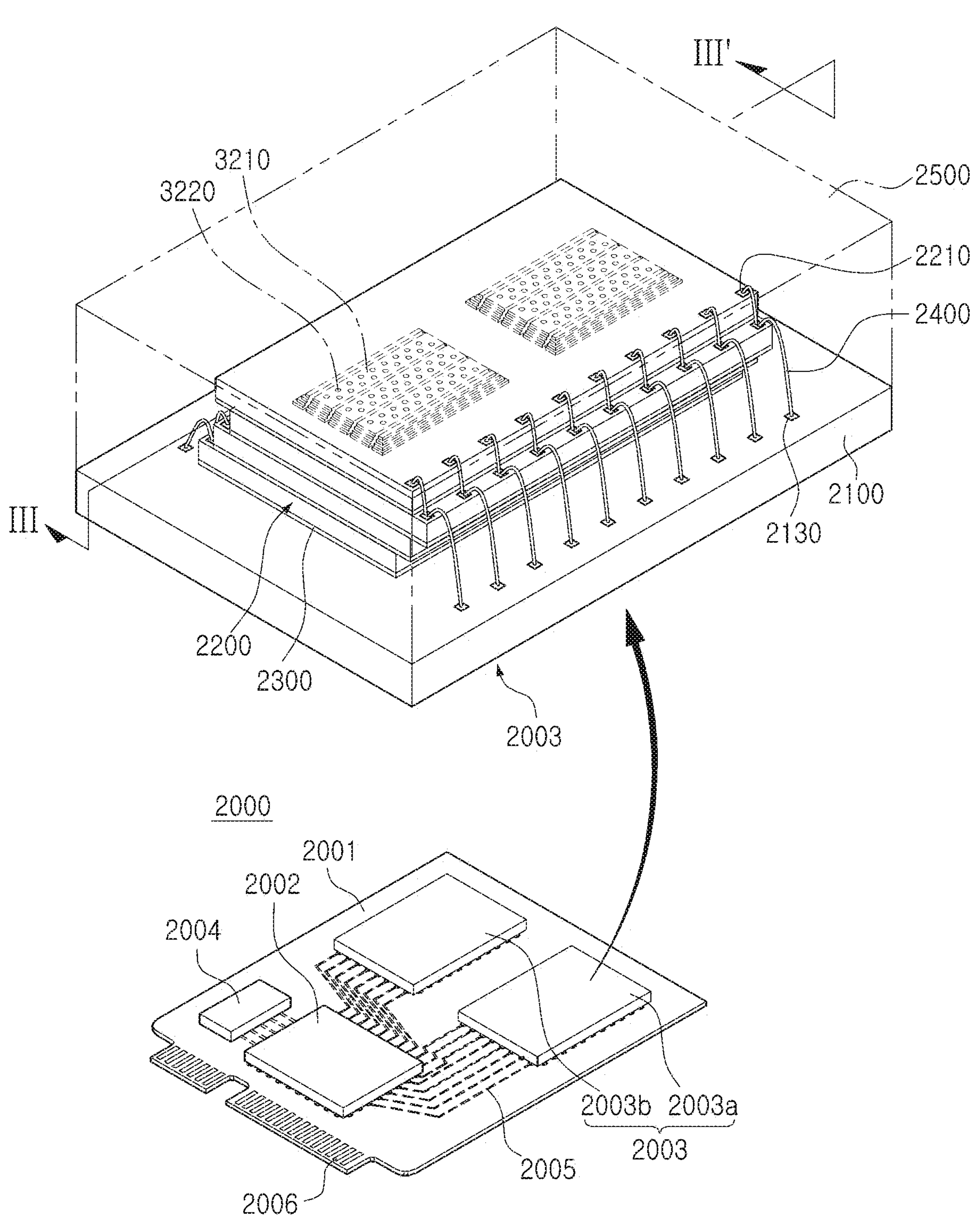
FIG. 20 is a perspective view schematically illustrating an electronic system including a semiconductor device according to an example embodiment.

FIG. 20 is a schematic perspective view of an electronic system including a semiconductor device according to an example embodiment.

Referring to FIG. 20, an electronic system 2000 according to an example embodiment of the present inventive concepts may include a main board 2001, a controller 2002 mounted on the main board 2001, one or more semiconductor packages 2003, and DRAM 2004. The semiconductor package 2003 and the DRAM 2004 may be connected to the controller 2002 by wiring patterns 2005 formed on the main board 2001.

The main board 2001 may include a connector 2006 including a plurality of pins coupled to an external host. The number and arrangement of the plurality of pins in the connector 2006 may vary depending on a communication interface between the electronic system 2000 and the external host. In some example embodiments, the electronic system 2000 may communicate with the external host according to any one of interfaces such as a universal serial bus (USB), a peripheral component interconnect express (PCI-Express), serial advanced technology attachment (SATA), an M-Phy for universal flash storage (UFS), etc. In some example embodiments, the electronic system 2000 may operate by power supplied from the external host through the connector 2006. The electronic system 2000 may further include a power management integrated circuit (PMIC) for distributing power supplied from the external host to the controller 2002 and the semiconductor package 2003.

The controller 2002 may write data to or read data from the semiconductor package 2003, and may improve an operating speed of the electronic system 2000.

The DRAM 2004 may be a buffer memory for mitigating a speed difference between the semiconductor package 2003 as a data storage space and the external host. The DRAM 2004 included in the electronic system 2000 may operate as a kind of cache memory, and may provide a space for temporarily storing data in a control operation on the semiconductor package 2003. When the electronic system 2000 may include the DRAM 2004, the controller 2002 may further include a DRAM controller for controlling the DRAM 2004 in addition to the NAND controller for controlling the semiconductor package 2003.

The semiconductor package 2003 may include first and second semiconductor packages 2003*a* and 2003*b* spaced apart from each other. Each of the first and second semiconductor packages 2003*a* and 2003*b* may be a semiconductor package including a plurality of semiconductor chips 2200. Each of the first and second semiconductor packages 2003*a* and 2003*b* may include a package substrate 2100, semiconductor chips 2200 on the package substrate 2100, adhesive layers 2300 disposed on lower surfaces of the semiconductor chips 2200, respectively, a connection structure 2400 electrically connecting the semiconductor chips 2200 to the package substrate 2100, and a molding layer 2500 covering the semiconductor chips 2200 and the connection structure 2400 on the package substrate 2100.

The package substrate 2100 may be a printed circuit board including package upper pads 2130. Each semiconductor chip 2200 may include an I/O pad 2210. The I/O pad 2210 may correspond to the I/O pad 1101 of FIG. 19. Each of the semiconductor chips 2200 may include stack structures 3210 and channel structures 3220. Each of the semiconductor chips 2200 may include the semiconductor device described above with reference to FIGS. 1 to 9.

In some example embodiments, the connection structure 2400 may be a bonding wire electrically connecting the I/O pad 2210 to the package upper pads 2130. Accordingly, in each of the first and second semiconductor packages 2003*a* and 2003*b*, the semiconductor chips 2200 may be electrically connected to each other by a bonding wire method, and may be electrically connected to the package upper pads 2130 of the package substrate 2100. According to some example embodiments, in each of the first and second semiconductor packages 2003*a* and 2003*b*, the semiconductor chips 2200 may be electrically connected to each other by a connection structure including a through-electrode (through silicon via (TSV)) instead of the bonding wire-type connection structure 2400.

In some example embodiments, the controller 2002 and the semiconductor chips 2200 may be included in one package. In an example embodiment, the controller 2002 and the semiconductor chips 2200 may be mounted on a separate interposer substrate different from the main substrate 2001, and the controller 2002 and the semiconductor chips may be connected to each other by a wiring formed on the interposer substrate.

Figure 21:
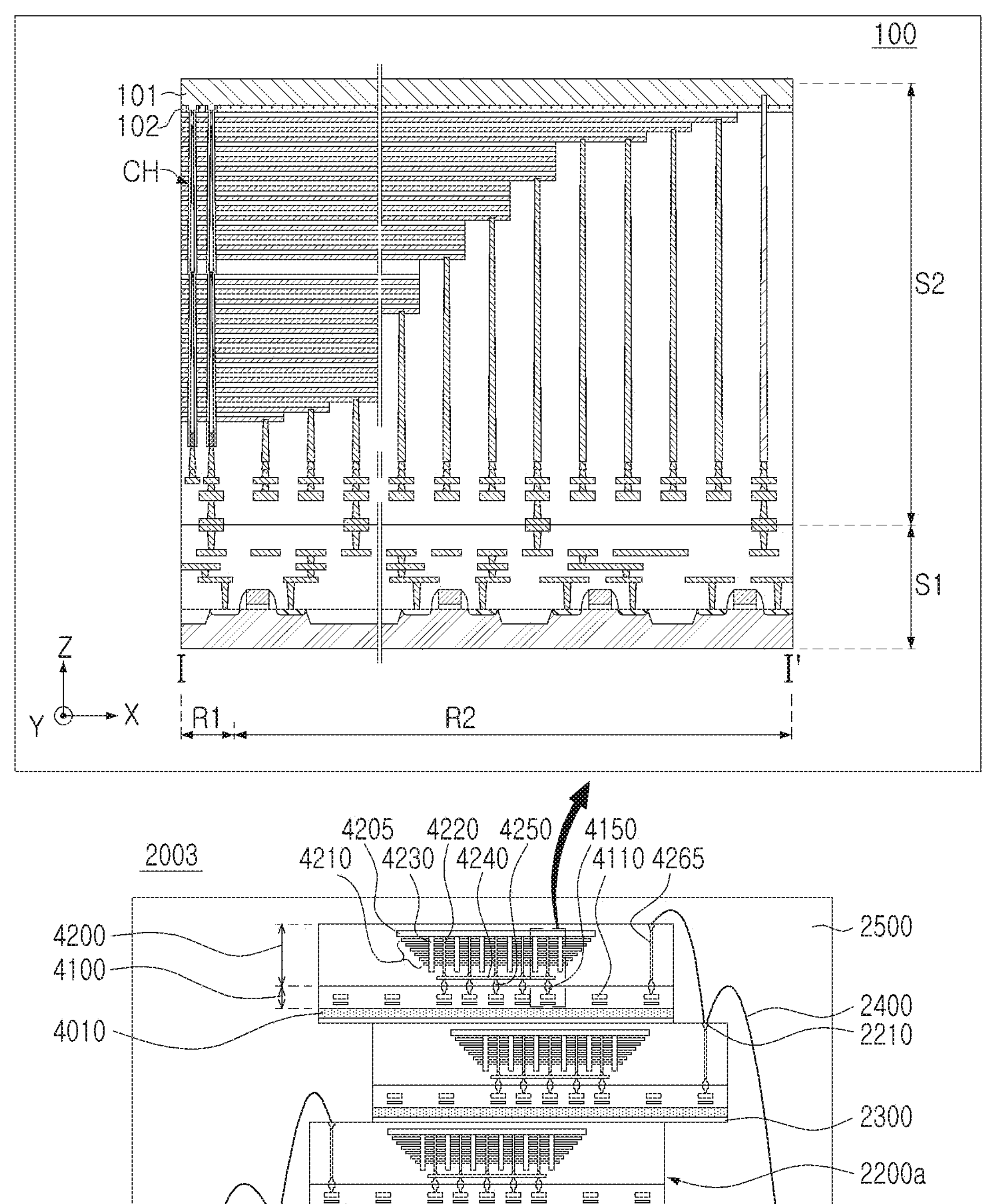
FIG. 21 is a cross-sectional view schematically illustrating a semiconductor package according to an example embodiment.

FIG. 21 is a cross-sectional view schematically illustrating a semiconductor package according to an example embodiment. FIG. 21 illustrates an example embodiment of the semiconductor package 2003 of FIG. 20, and conceptually illustrates a region taken along line of the semiconductor package 2003 of FIG. 20.

Referring to FIG. 21, in the semiconductor package 2003, each of the semiconductor chips 2200*a* may include a semiconductor substrate 4010, a first structure 4100 on the semiconductor substrate 4010, and a second structure 4200 bonded to the first structure 4100 on the first structure 4100 in a wafer bonding method.

The first structure 4100 may include a peripheral circuit region including a peripheral wiring 4110 and first bonding structures 4150. The second structure 4200 may include a common source line 4205, a stack structure 4210 between the common source line 4205 and the first structure 4100, and channel structures 4220 passing through gate stack structure 4210 and a separation region 4230, and second bonding structures 4250 electrically connected to the word lines (WL of FIG. 1) of the gate stack structure 4210 and the memory channel structures 4220, respectively. For example, the second bonding structures 4250 may be electrically connected to the memory channel structures 4220 and the word lines (WL of FIG. 19) through bit lines 4240 electrically connected to the memory channel structures 4220 and gate contacts (160 of FIG. 2A) electrically connected to word lines (WL of FIG. 1), respectively. The first bonding structures 4150 of the first structure 4100 and the second bonding structures 4250 of the second structure 4200 may be bonded while being in contact with each other. Bonded portions of the first bonding structures 4150 and the second bonding structures 4250 may be formed of, for example, copper (Cu).

As illustrated in the enlarged view, each of the semiconductor chips 2200*a* may further include channel structures CH passing through the stack structure and the intermediate insulating layer 102 to contact the plate layer 101. Each of the semiconductor chips 2200*a* may further include an input/output pad 2210 and an input/output connection line 4265 below the input/output pad 2210. The input/output connection line 4265 may be electrically connected to some of the second bonding structures 4210.

The semiconductor chips 2200*a* of FIG. 21 may be electrically connected to each other by connection structures 2400 in the form of bonding wires. However, in some example embodiments, semiconductor chips in one semiconductor package, such as the semiconductor chips 2200*a* of FIG. 21, may be electrically connected to each other by a connection structure including a through-electrode TSV.

Any functional blocks shown in the figures and described above may be implemented in processing circuitry such as hardware including logic circuits, a hardware/software combination such as a processor executing software, or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, application-specific integrated circuit (ASIC), etc.

According to some example embodiments of the inventive concepts, by enlarging the upper portion of the channel structure in contact with the plate layer, the semiconductor device and the electronic system may have improved operational characteristics, thereby providing reliability.

While some example embodiments have been illustrated and described above, it will be apparent to those skilled in the art that modifications and variations could be made without departing from the scope of the present inventive concepts as defined by the appended claims.

What is claimed is:

1. A semiconductor device comprising:

a first substrate structure including a substrate, circuit elements on the substrate, a first interconnection structure on the circuit elements, and first bonding layers on the first interconnection structure; and a second substrate structure on the first substrate structure, wherein the second substrate structure includes a plate layer, an intermediate insulating layer below the plate layer, a stack structure below the intermediate insulating layer and including gate electrodes and interlayer insulating layers alternately stacked on each other in a first direction, the first direction being perpendicular to a lower surface of the intermediate insulating layer, a channel structure including a dielectric layer, a first semiconductor layer, a second semiconductor layer, and a buried layer that are in sequence from the stack structure in a channel hole, the channel hole passing through the intermediate insulating layer and the stack structure and extending in the first direction, a second interconnection structure below the channel structure and the stack structure, and second bonding layers below the second interconnection structure and connected to the first bonding layers, wherein, in the channel hole, the intermediate insulating layer has a first side surface, the stack structure has a second side surface that is not aligned with the first side surface, the stack structure has an upper surface exposed from the intermediate insulating layer, the dielectric layer and the first semiconductor layer cover the first side surface of the intermediate insulating layer and the second side surface and the upper surface of the stack structure, and the second semiconductor layer covers a portion of the second side surface of the stack structure and is at a level lower than a level of a lower surface of an uppermost gate electrode among the gate electrodes of the stack structure.

2. The semiconductor device of claim 1, wherein the dielectric layer includes a ferroelectric material or an anti-ferroelectric material, the ferroelectric material including at least one of hafnium (Hf), zirconium (Zr), silicon (Si), yttrium (Y), aluminum (Al), gadolinium (Gd), strontium (Sr), lanthanum (La), titanium (Ti), and oxides thereof.

3. The semiconductor device of claim 1, wherein the intermediate insulating layer includes silicon nitride.

4. The semiconductor device of claim 1, wherein the first semiconductor layer includes at least one of zinc tin oxide (ZTO), indium zinc oxide (IZO), ZnO, indium gallium zinc oxide (IGZO), indium gallium silicon oxide (IGSO), indium oxide (InO), tin oxide (SnO), titanium oxide (TiO), zinc oxynitride (ZnON), magnesium zinc oxide (MgZnO), indium zinc oxide (InZnO), indium gallium zinc oxide (InGaZnO), zirconium indium zinc oxide (ZrInZnO), hafnium indium zinc oxide (HfInZnO), tin indium zinc oxide (SnInZnO), aluminum tin indium zinc oxide (AlSnInZnO), silicon indium zinc oxide (SiInZnO), zinc tin oxide (ZnSnO), aluminum zinc tin oxide (AlZnSnO), gallium zinc tin oxide (GaZnSnO), and zirconium zinc tin oxide (ZrZnSnO).

5. The semiconductor device of claim 1, wherein the second semiconductor layer includes polycrystalline silicon (Si).

6. The semiconductor device of claim 1, wherein the plate layer includes a protrusion extending into an inside of the channel hole.

7. The semiconductor device of claim 6, wherein the protrusion contacts the first semiconductor layer and the buried layer inside the channel hole.

8. The semiconductor device of claim 6, wherein a lowermost end of the protrusion is at a level higher than a level of an upper surface of an uppermost gate electrode among the gate electrodes of the stack structure.

9. The semiconductor device of claim 1, wherein the dielectric layer and the first semiconductor layer have an upper surface at a same level as a level of an upper surface of the intermediate insulating layer.

10. The semiconductor device of claim 1, wherein the gate electrodes include polycrystalline silicon.

11. The semiconductor device of claim 1, wherein the buried layer has a first diameter in a first region surrounded by the first semiconductor layer and a second diameter smaller than the first diameter in a second region surrounded by the second semiconductor layer.

12. The semiconductor device of claim 1, wherein the channel structure further includes a channel pad at a lower portion of the channel structure.

13. A semiconductor device comprising:

a first substrate structure including a substrate, circuit elements on the substrate, and first bonding layers on the circuit elements; and a second substrate structure on the first substrate structure, wherein the second substrate structure includes a plate layer, an intermediate insulating layer below the plate layer and including silicon nitride, gate electrodes below the intermediate insulating layer and stacked to be spaced apart from each other in a first direction, the first direction being perpendicular to a lower surface of the intermediate insulating layer, a channel structure in a channel hole passing through the intermediate insulating layer and the gate electrodes and extending in the first direction, the channel structure including a semiconductor layer, and second bonding layers below the gate electrodes and connected to the first bonding layers, wherein the channel hole has a first width in a first portion passing through the gate electrodes and a second width in a second portion passing through the intermediate insulating layer, the second width being wider than the first width, and the plate layer includes a protrusion in contact with the semiconductor layer in the second portion.

14. The semiconductor device of claim 13, wherein the channel structure further includes a dielectric layer between the gate electrodes and the semiconductor layer, and the dielectric layer includes a ferroelectric material or an anti-ferroelectric material.

15. The semiconductor device of claim 14, wherein the semiconductor layer includes a first semiconductor layer on the dielectric layer and a second semiconductor layer on the first semiconductor layer, and the second semiconductor layer is at a level lower than a level of a lower surface of an uppermost gate electrode among the gate electrodes.

16. The semiconductor device of claim 14, wherein the dielectric layer and the semiconductor layer have an upper surface at a same level as a level of an upper surface of the intermediate insulating layer.

17. The semiconductor device of claim 13, wherein the channel structure includes a blocking layer, a data storage layer, a tunneling layer, a first semiconductor layer, and a second semiconductor layer that are in sequence from the gate electrodes.

18. The semiconductor device of claim 17, wherein the gate electrodes include an erase gate electrode at an uppermost portion and a ground selection gate electrode below the erase gate electrode, the blocking layer, the data storage layer, the tunneling layer, and the first semiconductor layer each have an upper surface at a same level as a level of an upper surface of the intermediate insulating layer; and the second semiconductor layer is at a level below a lower surface of the ground selection gate electrode.

19. An electronic system comprising:

a semiconductor storage device including a first substrate structure including circuit elements and first bonding layers, a second substrate structure including second bonding layers connected to the first bonding layers, and an input/output pad electrically connected to the circuit elements; and a controller electrically connected to the semiconductor storage device through the input/output pad and configured to control the semiconductor storage device, wherein the second substrate structure include a plate layer, an intermediate insulating layer below the plate layer and including silicon nitride, gate electrodes below the intermediate insulating layer and stacked to be spaced apart from each other in a first direction, the first direction being perpendicular to a lower surface of the intermediate insulating layer, and a channel structure in a channel hole passing through the intermediate insulating layer and the gate electrodes, and extending in the first direction, the channel structure including a semiconductor layer, wherein the channel hole has a first width in a first portion passing through the gate electrodes and a second width in a second portion passing through the intermediate insulating layer, the second width being wider than the first width, and the plate layer includes a protrusion in contact with the semiconductor layer in the second portion.

20. The electronic system of claim 19, wherein the semiconductor layer includes a first semiconductor layer and a second semiconductor layer, the first semiconductor layer has an upper surface is at a same level as a level of an upper surface of the intermediate insulating layer, and the second semiconductor layer is at a level below a level of a lower surface of an uppermost gate electrode among the gate electrodes.

* * * * *